(12) United States Patent
Ryu et al.

(10) Patent No.: US 10,631,448 B2
(45) Date of Patent: Apr. 21, 2020

(54) PORTABLE ELECTRONIC DEVICE WITH EMBEDDED ELECTRIC SHOCK PROTECTION FUNCTION

(71) Applicant: AMOTECH CO., LTD., Incheon (KR)

(72) Inventors: Jae Su Ryu, Seoul (KR); Byung Guk Lim, Incheon (KR); Kyu Hwan Park, Yongin-si (KR); Jun-Suh Yu, Incheon (KR)

(73) Assignee: AMOTECH CO., LTD., Incheon (KR)

( * ) Notice: Subject to any disclaimer, the term of this patent is extended or adjusted under 35 U.S.C. 154(b) by 334 days.

(21) Appl. No.: 15/547,358

(22) PCT Filed: Jan. 29, 2016

(86) PCT No.: PCT/KR2016/000989
§ 371 (c)(1),
(2) Date: Jul. 28, 2017

(87) PCT Pub. No.: WO2016/122245
PCT Pub. Date: Aug. 4, 2016

(65) Prior Publication Data
US 2018/0007817 A1    Jan. 4, 2018

(30) Foreign Application Priority Data

Jan. 29, 2015   (KR) .................. 10-2015-0014564
Jan. 29, 2016   (KR) .................. 10-2016-0011084

(51) Int. Cl.
*H05K 9/00* (2006.01)
*H05F 3/04* (2006.01)
(Continued)

(52) U.S. Cl.
CPC ......... *H05K 9/0079* (2013.01); *G06F 1/1626* (2013.01); *G06F 1/1656* (2013.01);
(Continued)

(58) Field of Classification Search
CPC ...... H05K 9/0079; H05F 3/04; H04M 1/0264; H04M 1/18; G06F 1/1626; G06F 1/1656; G06F 1/182
(Continued)

(56) References Cited

U.S. PATENT DOCUMENTS 6,570,099 B1 *   5/2003   Hirano .................... H01L 23/36
                                                              174/258
8,498,087 B2 *   7/2013   Rabu ..................... H01R 31/065
                                                              361/104
2006/0250211 A1 * 11/2006  Moriai .................. H01C 1/148
                                                              338/21

FOREIGN PATENT DOCUMENTS

JP      2005109996 A     4/2005
JP      2010-146779 A    7/2010
(Continued)

OTHER PUBLICATIONS

Korean Office Action, dated Jan. 29, 2018, for Korean Application No. KR 10-2016-0011084, 4 pages. (with English Translation).
(Continued)

*Primary Examiner* — Zeev V Kitov
(74) *Attorney, Agent, or Firm* — Seed IP Law Group LLP

(57) ABSTRACT

Provided is a portable electronic device with an embedded electric shock protection function. A portable electronic device with an embedded electric shock protection function according to an exemplary embodiment of the present invention comprises: a circuit board; a camera module mounted on the circuit board; a conductive cover disposed to cover a part of an upper side of the camera module; a conductive connecting part mounted on the circuit board and configured to come into electrical contact with the conductive cover; and an electric shock protection element mounted on the circuit board to be connected in series to the conductive connecting part and configured to pass static elec-
(Continued)

tricity introduced from the conductive cover and block a leakage current of an external power source introduced into a ground of the circuit board.

26 Claims, 25 Drawing Sheets

(51) Int. Cl.
    *H04M 1/02*     (2006.01)
    *G06F 1/16*     (2006.01)
    *G06F 1/18*     (2006.01)
    *H04M 1/18*     (2006.01)

(52) U.S. Cl.
    CPC ............... *G06F 1/182* (2013.01); *H05F 3/04* (2013.01); *H04M 1/0202* (2013.01); *H04M 1/0264* (2013.01); *H04M 1/18* (2013.01)

(58) Field of Classification Search
    USPC .............................................................. 361/1
    See application file for complete search history.

(56) References Cited

FOREIGN PATENT DOCUMENTS

| KR | 1999-016743 A | 3/1999 |
|---|---|---|
| KR | 100573364 A | 4/2006 |
| KR | 100730062 B1 | 6/2007 |
| KR | 20100043518 A | 4/2010 |
| KR | 10-2013-0026918 A | 3/2013 |
| KR | 101452540 B1 | 10/2014 |

OTHER PUBLICATIONS

Korean Office Action, dated Nov. 27, 2017, for Korean Application No. KR 10-2017-0079018, 4 pages. (with English Translation).

\* cited by examiner

PORTABLE ELECTRONIC DEVICE WITH EMBEDDED ELECTRIC SHOCK PROTECTION FUNCTION

BACKGROUND OF THE INVENTION

The present invention relates to a portable electronic device, and more particularly, to a portable electronic device with an embedded electric shock protection function capable of protecting an internal circuit and/or a user from a leakage current and static electricity by providing an electric shock protection element connected to a conductor in the portable electronic device, wherein the conductor is exposed to the outside.

Today, portable electronic devices, such as mobile phones, include metal cases which are exposed to the outside of housings to improve aesthetics, robustness, and reception sensitivity.

Such portable electronic devices generally use an adaptor to charge a battery.

However, in a portable electronic device including a metal case which is exposed to the outside, when a defective charger is used to charge the portable electronic device, a leakage current is conducted to the metal case. When the portable electronic device comes into contact with a body of a user, the user feels a shooting pain due to the leakage current or the leakage current causes an electric shock in some cases.

This is because a protective element for protecting a user from a leakage current is not embedded in the defective charger. In addition, in a unofficial charger, when Y capacitors (Y-CAPs) configured as capacitors at both ends of a transformer to enhance electrical insulation of the transformer do not have a normal characteristic, direct current (DC) power may not be sufficiently blocked by the Y-CAPs, and moreover, a leakage current may be generated by alternating current (AC) power, and such a leakage current may propagate along a ground of a circuit. Therefore, the protective element for protecting a user from a leakage current needs to be embedded in a portable electronic device such as a mobile phone.

Meanwhile, the metal case exposed to the outside performs various roles, such as a simple stiffener, a ground, an antenna, and the like, according to a position thereof.

However, a low capacitance is good in a case in which the metal case is used as a ground, but, in a case in which the metal case is used as an antenna, the metal case is required to implement a high capacitance because the metal case operates in an open mode and a radio frequency (RF) signal is not smoothly transmitted when the capacitance is low.

That is, the capacitance is required to be increased or decreased according to the role of the metal case. This is because RF reception sensitivity is improved but the metal case is vulnerable to an electrostatic discharge (ESD) when a high capacitance is used.

Therefore, the protective element should also be disposed between the metal case and a receiver impedance matching line inside the housing to perform an appropriate role according to the role of the metal case.

That is, while the protective element operates close to a short mode and can smoothly protect against a leakage current and static electricity, there is an urgent necessity to develop a protective element capable of improving RF reception sensitivity by allowing the protective element itself to have a high capacitance.

In addition, in a case of a portable electronic device with a camera module, because the camera module is exposed to the outside, there is a very high possibility of an electric shock to a user or damage to an internal circuit due to the above-described electrostatic current or static electricity.

Specifically, because some static electricity propagates to a data line of the camera module when the static electricity is transmitted to the camera module, the static electricity causes screen division when capturing an image.

Therefore, there is a need for a method of eliminating adverse effects of static electricity from the outside or a leakage current of a circuit part on the camera module.

SUMMARY OF THE INVENTION

The present invention is directed to providing a portable electronic device with an embedded electric shock protection function capable of protecting an internal circuit and/or a user from static electricity or a leakage current.

One aspect of the present invention provides a portable electronic device with an embedded electric shock protection function, wherein the portable electronic device includes a circuit board, a camera module mounted on the circuit board, a conductive cover disposed to cover a part of an upper side of the camera module, a conductive connecting part mounted on the circuit board and configured to come into electrical contact with the conductive cover, and an electric shock protection element mounted on the circuit board to be connected in series to the conductive connecting part and configured to pass static electricity introduced from the conductive cover and block a leakage current of an external power source introduced into a ground of the circuit board.

The conductive cover may include a supporter which horizontally extends at a lower side thereof, and the conductive connecting part may be disposed at one side of the supporter.

The portable electronic device may further include a support member disposed between the other side of the supporter and the circuit board.

The support member may be any one of an insulator and the conductive connecting part.

A through-hole corresponding to a lens of the camera module may be provided at a center of the conductive cover.

The conductive cover and the conductive connecting part may be spaced a predetermined distance from the camera module.

The circuit board may include a pad and a wiring to electrically connect the conductive connecting part to the electric shock protection element in series.

The conductive connecting part may be disposed at a side portion of the conductive cover.

The electric shock protection element may satisfy the following expression:

$$Vbr > Vin$$

where, Vbr is a breakdown voltage of the electric shock protection element and Vin is a rated voltage of the external power source.

The conductive connecting part may be any one of a conductive gasket, a silicon rubber pad, and a clip-shaped conductor.

The conductive gasket may include at least one of a polymer body in which a conductive paste, a natural rubber, a sponge, a synthetic rubber, a heat-resistant silicon rubber, and a tube, formed by thermocompression bonding of a conductive paste.

The silicon rubber pad may include a body made of a silicon rubber and a conductive wire vertically formed inside the body.

The silicon rubber pad may include a body made of a silicon rubber, a plurality of conductive layers horizontally and alternately stacked inside the body, and a plurality of contact parts formed to have a curved protrusion shape at an upper side of the body.

The silicon rubber pad may include a body made of a non-conductive silicon rubber, a conductive part including a plurality of through-holes which are formed vertically through an inside of the body and filled with a conductive silicon rubber and conductive particles, and a plurality of contact parts formed to have a curved protrusion shape at both sides of the conductive part.

The clip-shaped conductor may include a contact part having a curved shape and configured to come into contact with the conductive cover, a bent part having an elastic force and configured to extend from the contact part, and a terminal part electrically connected to the electric shock protection element.

The electric shock protection element may include a sintered body formed by stacking a plurality of sheet layers and at least one pair of internal electrodes formed to be spaced a predetermined distance from each other inside the sintered body.

The electric shock protection element may further include an air gap formed between the pair of internal electrodes.

The air gap may include a discharge material layer coated on an inner wall thereof to a predetermined thickness in a height direction.

The pair of internal electrodes may be disposed on the same plane or may be disposed to face each other in a vertical direction.

The electric shock protection element may include at least two varistor material layers in which a first varistor material layer and a second varistor material layer are alternately stacked, a plurality of first internal electrodes spaced a predetermined distance ($L_1$) from each other on the first varistor material layer, and a plurality of second internal electrodes spaced a predetermined distance ($L_1$) from each other on the second varistor material layer.

The breakdown voltage (Vbr) may be a sum of unit breakdown voltages formed between the second internal electrode and each of the nearest first internal electrodes.

The first internal electrode and the second internal electrode may be disposed so that at least a part of the first internal electrode and at least a part of the second internal electrode overlap or do not overlap.

The distance ($L_1$) between the first internal electrodes or the distance ($L_1$) between the second internal electrodes may be greater than a shortest distance ($d_1$) between the first internal electrodes and the second internal electrodes.

Another aspect of the present invention provides a portable electronic device with an embedded electric shock protection function, wherein the portable electronic device includes a circuit board, a camera module mounted on the circuit board, a conductive cover disposed to cover a part of an upper side of the camera module, and an electric shock protection contactor having one end electrically connected to the conductive cover and the other end electrically connected in series to the circuit board. Here, the electric shock protection contactor includes a conductive connecting part having an elastic force and configured to come into electrical contact with the conductive cover, and an electric shock protection element connected in series to the conductive connecting part and configured to pass static electricity introduced from the conductive cover and block a leakage current of an external power source introduced into a ground of the circuit board.

The electric shock protection element may include a connecting electrode on an upper surface thereof and an external electrode on a lower surface thereof, and the conductive connecting part is stacked on the connecting electrode formed on the upper surface of the electric shock protection element via a conductive adhesive layer.

The electric shock protection element may include an accommodation part formed on an upper side thereof, a connecting electrode formed on a bottom surface of the accommodation part, and a conductive adhesive layer formed on an upper surface of the connecting electrode, wherein the conductive connecting part may be fixed by the conductive adhesive layer.

According to the portable electronic device with an embedded electric shock protection function according to one embodiment of the present invention, an internal circuit and a user can be protected from a leakage current and static electricity by providing at least one electric shock protection element which connects a conductor to a circuit part in the portable electronic device, wherein the conductor, such as a metal case, is exposed to the outside.

DETAILED DESCRIPTION OF PREFERRED EMBODIMENTS

Figure 1:
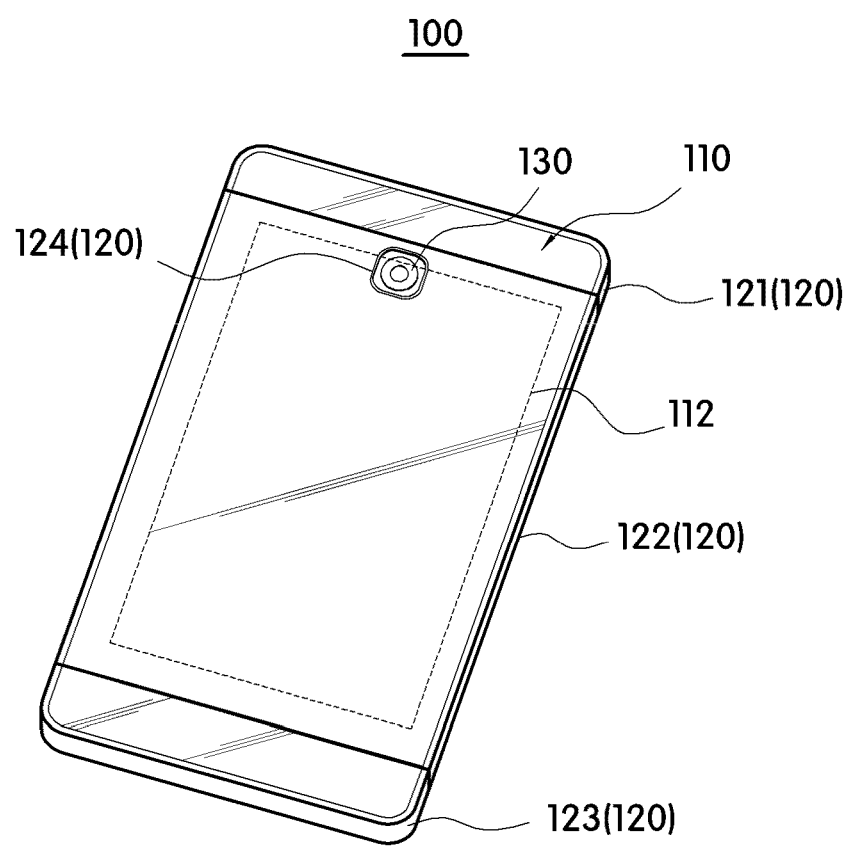
FIG. 1 is a diagram of an exemplary portable electronic device with an embedded electric shock protection function according to one embodiment of the present invention.

Hereinafter, embodiments of the present invention will be described in detail with reference to the accompanying drawings to be easily performed by those skilled in the art. The present invention may be implemented in several different forms, and is not limited to embodiments described herein. Parts irrelevant to the description will be omitted from the drawings in order to clearly explain the present invention. The same or similar elements will be denoted by the same reference numerals throughout this specification.

A portable electronic device 100 with an embedded electric shock protection function according to one embodiment of the present invention includes an electronic device housing 110, conductors 120, and electric shock protection elements.

The electronic device housing 110 may include a display 112 for displaying information, and various circuits and parts for operating an electronic device are embedded therein.

Here, the electronic device may be a portable electronic device that is portable and easy to carry. For example, the electronic device may be a portable terminal such as a smart phone, a cellular phone, and the like, and may be a smart watch, a digital camera, a digital multimedia broadcasting (DMB) device, an electronic book, a netbook, a tablet PC, a portable computer, or the like. The electronic device may include any appropriate electronic component including an antenna structure for communication with an external device. In addition, the electronic device may be a device using short-distance network communication such as Wi-Fi and Bluetooth.

Hereinafter, it is assumed that a portable terminal is used as an example of the electronic device for convenience of description.

That is, the electronic device housing 110 may be a housing of the portable terminal. The electronic device housing 110 may be made of conductive materials such as a metal (aluminum, stainless steel, etc.), and may be made of carbon-fiber synthetic materials, other fiber-based composites, glasses, ceramics, plastics, or combinations thereof.

In addition, the display 112 may be a touch screen type display used for collecting user touch inputs.

In this case, the electronic device housing 110 may be made of a metal and may include the conductors 120 exposed to the outside.

The conductors 120 may be provided to partially or entirely surround side portions of the electronic device housing 110.

In this case, the conductors 120 may be connected to a ground of a circuit board embedded in the electronic device housing 110 through electric shock protection elements 200, 200', 300, 300', 400, and 400' for protecting an internal circuit from a leakage current and static electricity.

The electric shock protection elements 200, 200', 300, 300', 400, and 400' may prevent transmission of a current leaked through the conductors 120 to a user or prevent transmission of static electricity toward the circuit in a process in which the user touches the electronic device housing 110.

The number of electric shock protection elements 200, 200', 300, 300', 400, and 400' may be appropriately provided to correspond to the number of conductors 120 provided in the electronic device housing 110. However, when the plurality of conductors 120 are provided, conductors 121, 122, 123, and 124 are embedded in the electronic device housing 110 such that the electric shock protection elements 200, 200', 300, 300', 400, and 400' are individually connected to all of the conductors 121, 122, 123, and 124.

Figure 2:
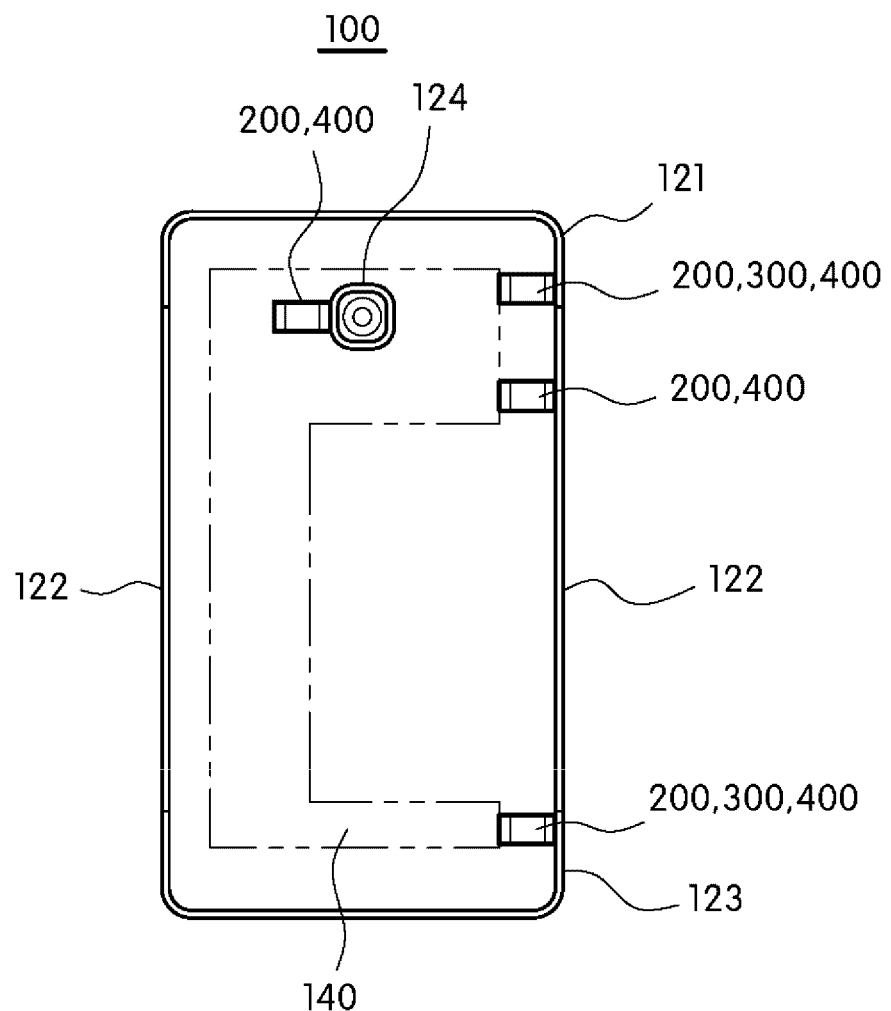
FIG. 2 is a conceptual diagram exemplarily illustrating positions at which electric shock protection elements in FIG. 1 are applied.

That is, as illustrated in FIG. 2, when three conductors 120 which surround the side portion of the electronic device housing 110 are provided, each of the conductors 121, 122, and 123 is connected to the electric shock protection elements 200, 200', 300, 300', 400, and 400' to protect a user from a leakage current and protect the circuits inside the electronic device housing 110 from static electricity.

In this case, when the plurality of conductors 121, 122, 123, and 124 are provided, the electric shock protection elements 200, 200', 300, 300', 400, and 400' may be provided in various ways according to corresponding roles of the conductors 121, 122, 123, and 124.

For example, when the conductor 122 serves as a ground, the electric shock protection elements 200, 200', 300, 300', 400, and 400' may be connected to the conductor 122 to block a leakage current and protect the internal circuit from static electricity.

When the conductors 122 and 123 are used as radiators of an antenna, the electric shock protection elements 200, 200', 300, 300', 400, and 400' may include capacitors 220a and 220b capable of increasing a capacitance thereof to increase radio frequency (RF) reception sensitivity.

Meanwhile, when a camera 130 exposed to the outside is provided in the electronic device housing 110, the electric shock protection element 200, 200', 300, 300', 400, or 400' may block a leakage current and protect the internal circuit from static electricity by the electric shock protection element 200, 200', 300, 300', 400, or 400' being applied to the conductor 124 which surrounds the camera 130.

Figure 3:
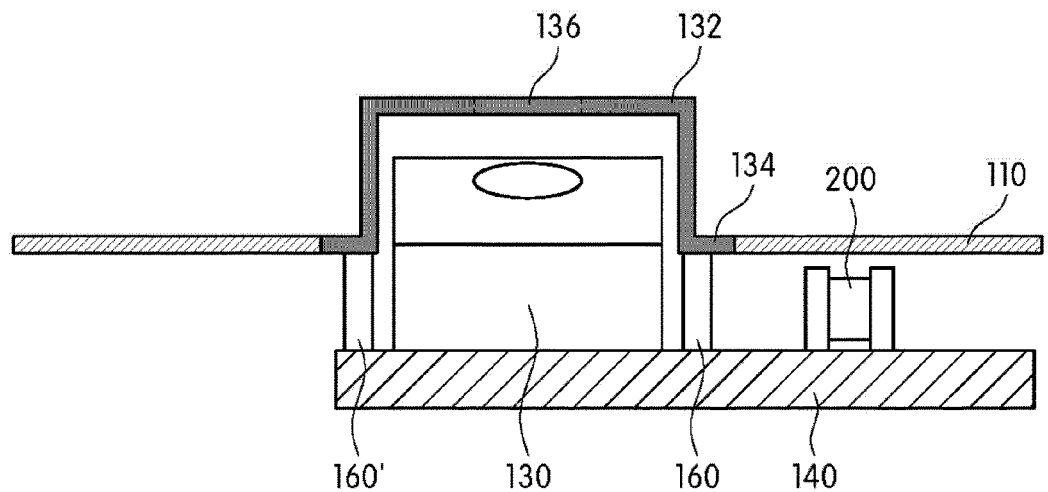
FIG. 3 is a cross-sectional view illustrating a state in which the electric shock protection element in FIG. 2 is applied to a camera module.

As illustrated in FIG. 3, the portable electronic device 100 with an embedded electric shock protection function includes the camera module 130, a conductive cover 132, a circuit board 140, a conductive connecting part 160, and the electric shock protection element 200.

The camera module 130 is an optical module including a lens and is mounted on the circuit board 140 so that the lens faces outward. The camera module 130 may include a data line for connecting to the circuit board 140.

The conductive cover 132 is made of a metal material and is disposed to cover a part of an upper side of the camera module 130. The conductive cover 132 may include a supporter 134 which extends horizontally at a lower side of the conductive cover 132. That is, the conductive cover 132 may be mounted on the circuit board 140 through the supporter 134.

Here, the supporter 134 may be formed along an outer periphery of the conductive cover 132 at the lower side thereof or may be formed at a part of the outer periphery.

Also, the conductive cover 132 may include a through-hole 136 corresponding to the lens of the camera module 130 at the center of an upper surface of the conductive cover 132.

The conductive cover 132 may have a rectangular shape and include the supporter 134 which extends horizontally at the lower side of the conductive cover 132 and the circular or elliptical through-hole 136 on the upper surface of the conductive cover 132.

Only the lens of the camera module 130 may be exposed to the outside by the conductive cover 132, and the other portions of the camera module 130 may be covered and protected by the conductive cover 132.

In this case, the conductive cover 132 may be spaced a predetermined distance from the camera module 130 to protect the camera module 130 and prevent external electrical influences.

The camera module 130 is mounted on the circuit board 140, and the conductive connecting part 160 and the electric shock protection element 200 are mounted on the circuit board 140.

In this case, the circuit board 140 may include pads and wirings so that the conductive connecting part 160 and the electric shock protection element 200 are electrically connected in series. That is, the circuit board 140 may include a pad corresponding to a shape of a lower surface of the conductive connecting part 160 and for mounting the conductive connecting part 160, and a pad corresponding to a shape of an external electrode of the electric shock protection element 200 and for mounting the electric shock protection element 200.

The conductive connecting part 160 comes into electrical contact with the conductive cover 132 and is mounted on the circuit board 140. The conductive connecting part 160 may have an elastic force. Here, the conductive connecting part 160 may be any one of a conductive gasket, a silicon rubber pad, and a clip-shaped conductor.

In this case, the conductive cover 132 may be pressed toward the circuit board 140 when the conductive cover 132 is pressed from an upper side thereof, and the conductive cover 132 may be restored to an original state thereof when the conductive cover 132 is removed.

Here, the conductive connecting part 160 may be disposed at one side of the supporter 134. That is, the conductive connecting part 160 may be disposed to come into contact with a part of the supporter 134 provided along the outer periphery of the conductive cover 132 at the lower side thereof.

For example, the conductive connecting part 160 may be disposed at the lower side of the conductive cover 132, and thus may be vertically disposed between the conductive cover 132 and the circuit board 140.

Since the conductive connecting part 160 may horizontally protrude due to an elastic force generated by the pressing of the conductive cover 132, the conductive connecting part 160 may be spaced a predetermined distance from the camera module 130 so as not to have an electric influence on the camera module 130.

Here, although the conductive connecting part 160 is described as being vertically disposed between the conductive cover 132 and the circuit board 140, the present invention is not limited thereto, and the conductive connecting part 160 may be horizontally disposed with respect to the conductive cover 132.

That is, the conductive connecting part 160 may be disposed to come into electrical contact with a side surface of the conductive cover 132. In this case, the conductive cover 132 may be mounted on the circuit board 140 through an insulator.

The electric shock protection element 200 is mounted on the circuit board 140 to be connected in series to the conductive connecting part 160. The electric shock protection element 200 may pass static electricity introduced from the conductive cover 132 and have a breakdown voltage Vbr, which satisfies the following expression, to block a leakage current of an external power source introduced into a ground of the circuit board 140:

$$Vbr > Vin$$

Where, Vbr is the breakdown voltage of the electric shock protection element and Vin is a rated voltage of the external power source.

In this case, the rated voltage may be a standard rated voltage for each country, and may be, for example, any one of 240 V, 110 V, 220 V, 120 V, and 100 V.

The electric shock protection element 200 may have a different function according to a leakage current due to the external power source, static electricity introduced from the conductor 120, and a communication signal.

That is, when the leakage current of the external power source is introduced into the conductive cover 132 through the circuit part mounted on the circuit board 140, for example, through the ground, because the breakdown voltage Vbr (or a trigger voltage) of the electric shock protection element 200 is greater than an overvoltage due to the leakage current, the electric shock protection element 200 may be maintained in an open state. That is, because the breakdown voltage Vbr of the electric shock protection element 200 is greater than the rated voltage of the external power source of the portable electronic device, the electric shock protection element 200 may be maintained in the open state without being electrically conducted to prevent the leakage current from being transmitted to the conductive cover 132 that can be come into contact with a human body such as a metal case.

In this case, since a capacitor layer may block a DC component included in the leakage current and the leakage current has a relatively lower frequency than that in a wireless communication band, the capacitor layer may act as if it had a large impedance with respect to the corresponding frequency, thereby blocking the leakage current.

As a result, the electric shock protection element 200 may block the leakage current of the external power source introduced from the ground of the circuit part 14 to protect a user from an electric shock.

Also, when static electricity is introduced from the outside through the conductive cover 132, the electric shock protection element 200 functions as a static electricity protection element such as a suppressor or a varistor. That is, since an operating voltage of a suppressor or a varistor voltage (or a breakdown voltage) of a varistor for discharging static electricity is smaller than an instantaneous voltage of the static electricity, the electric shock protection element 200 may pass static electricity generated by an instantaneous discharge. As a result, when the static electricity is introduced from the conductive cover 132 through the conductive connecting part 160, an electrical resistance of the electric shock protection element 200 is lowered so that the static electricity may pass therethrough without being insulated and broken.

Here, the circuit part of the circuit board 140 may include a separate protective element for bypassing static electricity to the ground. As a result, the electric shock protection element 200 may protect an internal circuit of a rear end thereof by passing the static electricity without being insulated and broken by the static electricity introduced from the conductive cover 132 through the conductive connecting part 160.

As described above, since the electric shock protection element 200 connected in series to the conductive connecting part 160 is disposed between the circuit board 140 and the conductive cover 132, which is exposed to the outside, such that the electric shock protection element 200 passes the static electricity, which is introduced from the conductive cover 132, through the ground of the circuit board 140, damage to the internal circuit due to the static electricity may be prevented.

In addition, since the static electricity introduced from the conductive cover 132 is bypassed to the ground so as not to propagate to the data line of the camera module 130 and may electrically influence the data line of the camera module 130, an incorrect operation of the camera module 130, such as screen division, may be prevented.

Also, since the conductive cover 132 is electrically blocked from the circuit board 140 by the electric shock protection element 200 such that transmission of a current leaked by the external power source to the conductive cover 132 may be prevented, an electric shock to a user due to the leakage current may be prevented.

Meanwhile, the portable electronic device 100 with an embedded electric shock protection function may further include a support member 160' between the other side of the supporter 134 and the circuit board 140. That is, the support member 160' may be disposed at a portion of the supporter 134, with which the conductive connecting part 160 does not come into contact.

Preferably, the support member 160' may be disposed at a position symmetrical to the conductive connecting part 160 so that the conductive cover 132 may be stably fixed. That is, since the conductive connecting part 160 is disposed on a part of the lower portion of the conductive cover 132, a support member having the same height as the conductive connecting part 160 may be provided at an opposite side of the conductive connecting part 160 for horizontal balance and firm fixation.

The support member 160' may be made with an insulator to electrically insulate the conductive cover 132 from the circuit board.

Alternatively, the support member 160' may be the conductive connecting part 160. That is, at least two conductive connecting parts 160 may be disposed at the lower side of the conductive cover 132.

As described above, in the portable electronic device 100 with an embedded electric shock protection function according to one embodiment of the present invention, when the electronic device housing 110 includes the conductor 120 exposed to the outside, the electric shock protection elements 200, 200', 300, 300', 400, and 400' connected to the conductor 120 are embedded in the electronic device housing 110, and thus the leakage current may be blocked and the internal circuit may be protected from static electricity.

In addition, a capacitor may be added to the electric shock protection elements 200, 200', 300, 300', 400, and 400' according to the role of the conductor 120 such that providing a high capacitance and performing a complex role of increasing RF reception sensitivity may be simultaneously performed. Therefore, parts may be simplified and an unnecessary mounting area may be reduced so that the device may be made thinner and smaller.

In addition, various types of characteristics may be implemented by using an electric shock protection element having a low capacitance in addition to an electric shock protection element having a high capacitance according to the type of the electronic device used.

Each of the electric shock protection elements 200, 200', 300, 300', 400, and 400' may be provided in the form of a suppressor or a varistor.

Figure 4:
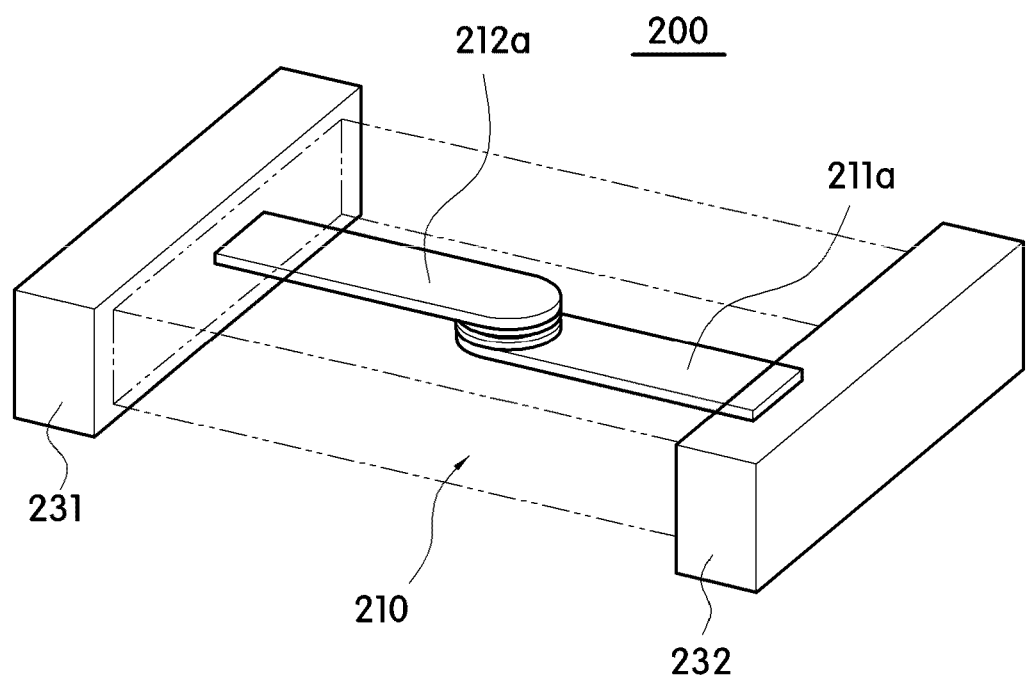
FIG. 4 is an overall perspective view illustrating an example of an electric shock protection element that can be used in a portable electronic device with an embedded electric shock protection function according to one embodiment of the present invention.
Figure 5:
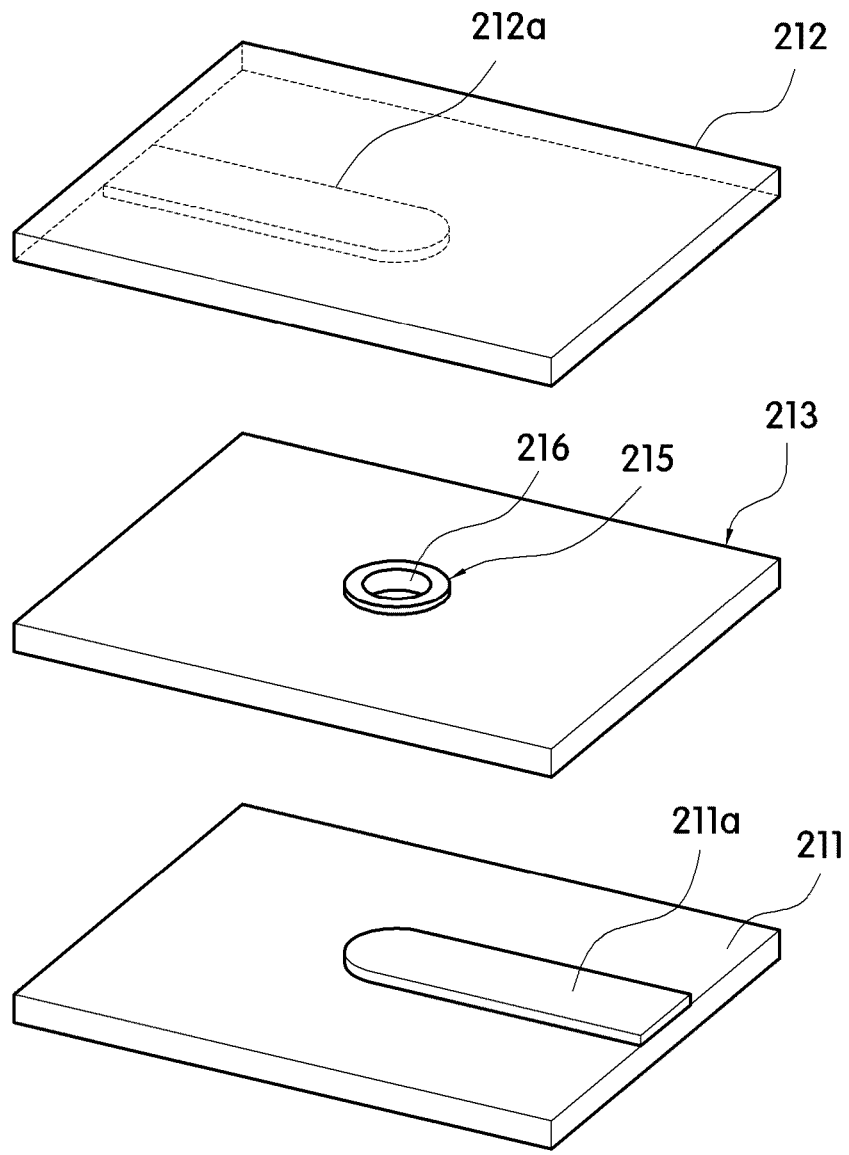
FIG. 5 is an exploded perspective view illustrating a stacking relationship of a plurality of sheet layers in FIG. 4.
Figure 6:
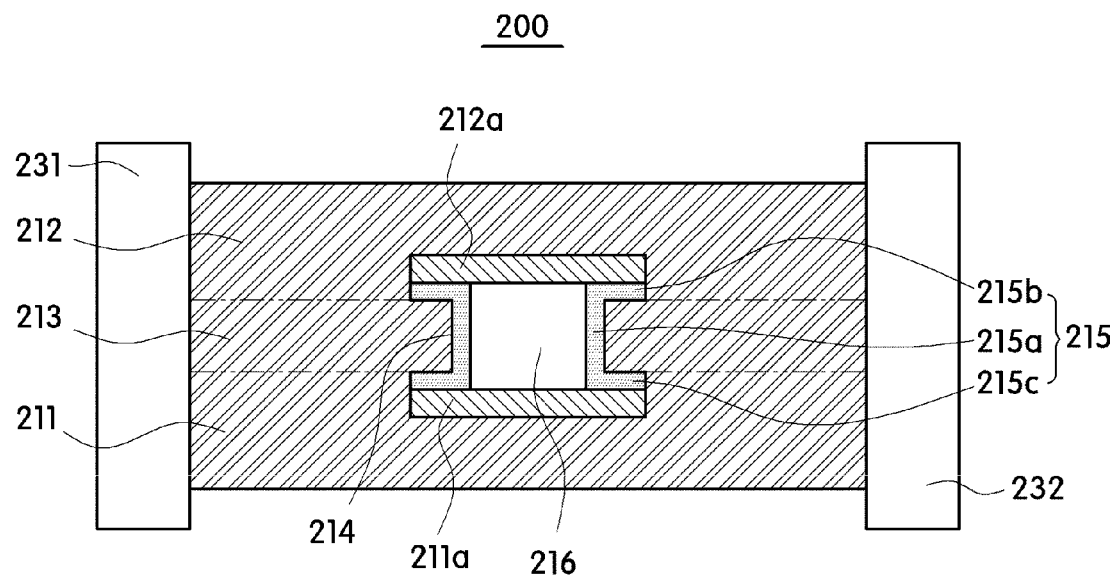
FIG. 6 is a longitudinal sectional view illustrating the plurality of sheet layers in FIG. 4.

FIGS. 4 to 6 illustrate an example of a suppressor which can be used when an electric shock protection element is provided in the form of a suppressor in the portable electronic device 100 with an embedded electric shock protection function according to one embodiment of the present invention.

That is, as illustrated in FIGS. 4 to 6, the electric shock protection element 200 includes a sintered body 210 and a pair of internal electrodes 211a and 212a.

The sintered body 210 is intended to normally pass an RF signal and to protect circuits of an electronic part when static electricity and an overvoltage are applied thereto. For example, the electronic part may be an electronic part used inside a portable terminal.

In this case, at least a pair of sheet layers 211 and 212 are sequentially stacked, the internal electrodes 211a and 212a respectively provided on one surfaces of the sheet layers 211 and 212 are disposed to face each other, and the sintered body 210 is then integrally formed through a pressing process, a sintering process, or a curing process.

The sintered body 210 may be made of an insulator having permittivity. For example, a low temperature sintered ceramic (LTCC), a high temperature sintered ceramic (HTCC), a magnetic material, or the like may be used as the insulator. In this case, the ceramic material is a metal-based oxide compound, and the metal-based oxide compound may include at least one selected from a group consisting of $Er_2O_3$, $Dy_2O_3$, $Ho_2O_3$, $V_2O_5$, CoO, $MoO_3$, $SnO_2$, $BaTiO_3$, and $Nd_2O_3$.

In this case, a protective sheet layer 213 is disposed between the pair of internal electrodes 211a and 212a corresponding to each other to protect against static electricity and to protect the circuit protection element and peripheral circuits from an overvoltage.

The protective sheet layer 213 is disposed between the pair of internal electrodes 211a and 212a, and at least one gap forming member 125 having a hollow form is provided between the pair of internal electrodes 211a and 212a facing each other. To this end, in the protective sheet layer 213, a through-hole 124 may be formed at a position at which the air gap forming member 125 is provided.

Specifically, as illustrated in FIGS. 5 and 6, in the sintered body, a first sheet layer 211 having the first internal electrode 211a provided on an upper surface thereof and a second sheet layer 212 having the second internal electrode 212a provided on a lower surface thereof are stacked, and the protective sheet layer 213 is disposed between the first sheet layer 211 and the second sheet layer 212.

That is, the first sheet layer 211, the protective sheet layer 213, and the second sheet layer 212 are sequentially stacked such that the first internal electrode 211a and the second internal electrode 212a may face each other.

Accordingly, after the first internal electrode 211a and the second internal electrode 212a are disposed to face each other and are spaced a predetermined distance from each other by the protective sheet layer 213. The first internal electrode 211*a* and the second internal electrode 212*a* are disposed so that one sides thereof come into contact with the air gap forming member 215.

As illustrated in FIG. 6, the through-hole 214 is formed in a region in which the first internal electrode 211*a* and the second internal electrode 212*a*, which are respectively disposed above and below the protective sheet layer 213, overlap each other.

In this case, the air gap forming member 215 may be provided in the through-hole 214. The air gap forming member 215 may be disposed between the internal electrodes 211*a* and 212*a* and may include discharge material layers 215*a*, 215*b*, and 215*c* which are coated on an inner wall of the through-hole 214 to a predetermined thickness in a height direction.

Alternatively, when the air gap forming member 215 is not separately provided, a discharge material layer is coated on the inner wall of the through-hole 214 to a predetermined thickness in the height direction, or at least a part of the through-hole 214 may be filled with the discharge material layer.

Here, the air gap forming member 215 or the discharge material layer coated on the inner wall of the through-hole 214 is provided so that an upper end thereof comes into contact with the second internal electrode 212*a* and a lower end thereof comes into contact with the first internal electrode 211*a*.

An air gap 216 may be formed between the pair of internal electrodes 211*a* and 212*a* by the air gap forming member 215. Static electricity introduced from the outside by the air gap 216 may be discharged between the internal electrodes 211*a* and 212*a*. In this case, an electrical resistance between the internal electrodes 211*a* and 212*a* may be lowered and a voltage difference between both ends of the electric shock protection element 200 may be reduced to a predetermined value or less. Therefore, the electric shock protection element 200 may pass the static electricity without being insulated and broken.

In this case, a discharge material constituting the discharge material layers 215*a*, 215*b*, and 215*c* should have low permittivity and no conductivity and not short when an overvoltage is applied.

To this end, the discharge material may be made of a nonconductive material containing at least one kind of metal particle, or a semiconductor material containing SiC or a silicon-based component. In addition, the discharge material may be made by mixing at least one material selected from a group consisting of SiC, carbon, graphite, and ZnO with at least one material selected from a group consisting of Ag, Pd, Pt, Au, Cu, Ni, W, and Mo at a predetermined ratio.

For example, when the first internal electrode 211*a* and the second internal electrode 212*a* include an Ag component, the discharge material may include a SiC—ZnO-based component. A SiC (Silicon carbide) component has excellent thermal stability, excellent stability in an oxidizing atmosphere, constant conductivity and heat conductivity, and low permittivity.

A ZnO component has excellent nonlinear resistance and discharge characteristics.

Both SiC and ZnO have conductivity when used separately, but ZnO bonds to a surface of SiC particles to form an insulating layer when SiC and ZnO are mixed and a sintering process is performed thereon.

In such an insulating layer, SiC completely reacts to form a SiC—ZnO reaction layer on the surface of the SiC particles. Accordingly, the insulating layer blocks passage of Ag and provides a higher insulating property to a discharge material A to improve resistance to static electricity, thereby solving a DC shorting phenomenon when the electric shock protection device is mounted on an electronic part.

Here, a material containing the SiC—ZnO-based component is described as an example of the discharge material, but the present invention is not limited thereto, and it should be noted that a semiconductor material that matches components constituting the first internal electrode 211*a* and the second internal electrode 212*a* or a non-conductive material including metal particles may be used as the discharge material.

In this case, the discharge material layers 215*a*, 215*b*, and 215*c* coated on the inner wall of the air gap forming member 215 may include the first part 215*a* coated along the inner wall of the air gap forming member 215, the second part 215*b* which extends from an upper end of the first part 215*a* along an upper surface of the protective sheet layer 213 to face and come into contact with the first internal electrode 211*a*, and the third part 215*c* which extends from a lower end of the first part 215*a* along a lower surface of the protective sheet layer 213 to face and come into contact with the second internal electrode 212*a*.

Accordingly, the discharge material layers 215*a*, 215*b*, and 215*c* may be formed so that the second part 215*b* and the third part 215*c* may respectively extend from the upper and lower ends of the air gap forming member 215 as well as from the inner wall of the air gap forming member 215, and thus may increase contact areas with the first internal electrode 211*a* and the second internal electrode 212*a*.

With this configuration, even when a part of each of the discharge material layers 215*a*, 215*b*, and 215*c* is damaged by a part of the component constituting each of the discharge material layers 215*a*, 215*b*, and 215*c* being vaporized by a static electricity spark, the discharge material layers 215*a*, 215*b*, and 215*c* may perform their functions, and thus resistance to static electricity may be improved.

Meanwhile, the protective sheet layer 213 may include a plurality of air gap forming members 215. In this way, when the number of the air gap forming members 215 is increased, the number of discharge paths of static electricity may be increased so that resistance to static electricity may be improved.

The protective sheet layer 213 disposed between the first sheet layer 211 and the second sheet layer 212 is provided to have the same area as the first sheet layer 211 and the second sheet layer 212, but it should be noted that the protective sheet layer 213 is provided to include an overlapping area of the first internal electrode 211*a* and the second internal electrode 212*a* corresponding to each other and to have a smaller area than the first sheet layer 211 and the second sheet layer 212.

Here, the first internal electrode 211*a* and the second internal electrode 212*a* may be formed to be spaced the predetermined distance from each other inside the sintered body, and may be formed as at least one pair. Here, the first internal electrode 211*a* and the second internal electrode 212*a* may be electrically connected to external electrodes 231 and 232, respectively, which are provided at both ends of the sintered body 210.

That is, one end of the first internal electrode 211*a* is connected to the first external electrode 231 and the second internal electrode 212*a* is electrically connected to the second external electrode 232 so that a voltage may be applied to the first internal electrode 211*a* and the second internal electrode 212*a*.

Here, the first internal electrode 211a and the second internal electrode 212a may include any one component of Ag, Au, Pt, Pd, Ni, and Cu, and the pair of external electrodes 231 and 232 may include one or more of Ag, Ni, and Sn components.

In this case, the distance between the internal electrodes 211a and 212a, an area in which the internal electrodes 211a and 212a face each other, or a length in which the internal electrodes 211a and 212a overlap each other may be configured to satisfy the breakdown voltage Vbr (or a trigger voltage) of the electric shock protection element 200, and the distance between the internal electrodes 211a and 212a may range from 10 to 100 μm. For example, the distance between the internal electrodes 211a and 212a may be 25 μm.

In this case, the first internal electrode 211a and the second internal electrode 212a constituting the internal electrodes in the sintered body may have various shapes and patterns. The first internal electrode 211a and the second internal electrode 212a may have the same pattern or different patterns.

Figure 7:
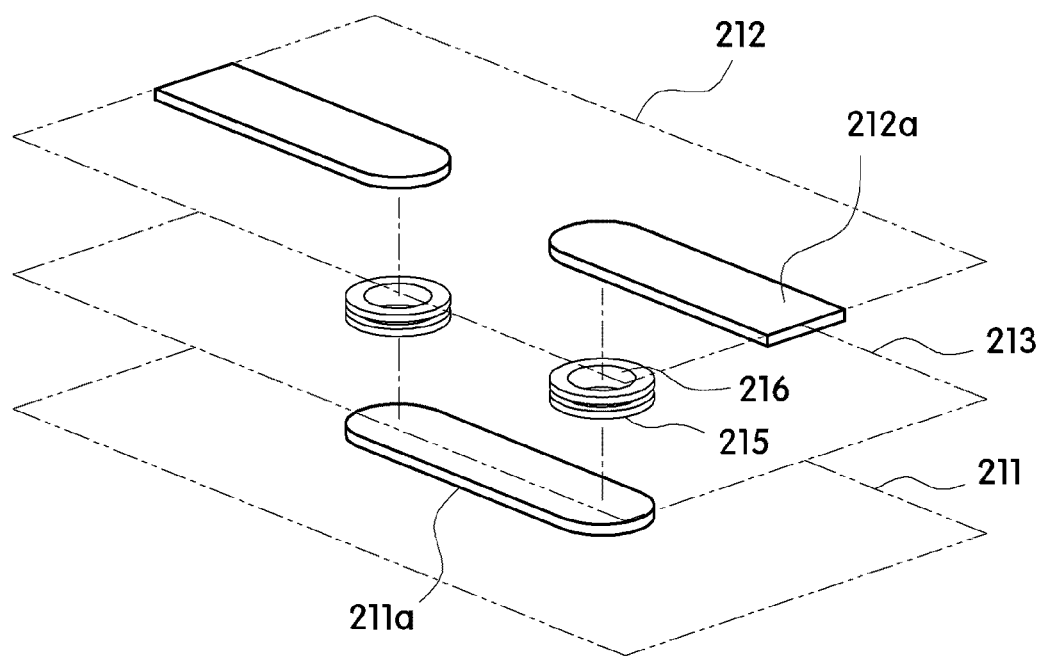
FIGS. 7 to 11 are views illustrating various forms of internal electrodes and air gaps which are provided inside a sintered body in FIG. 4.

For example, as illustrated in FIG. 7, end portions of a pair of second internal electrodes 212a may respectively overlap both ends of the bar-shaped first internal electrode 211a having a predetermined length s. One air gap forming member 215 in which a discharge material layer is coated on the inner wall may be disposed in an overlapping area.

Figure 8:
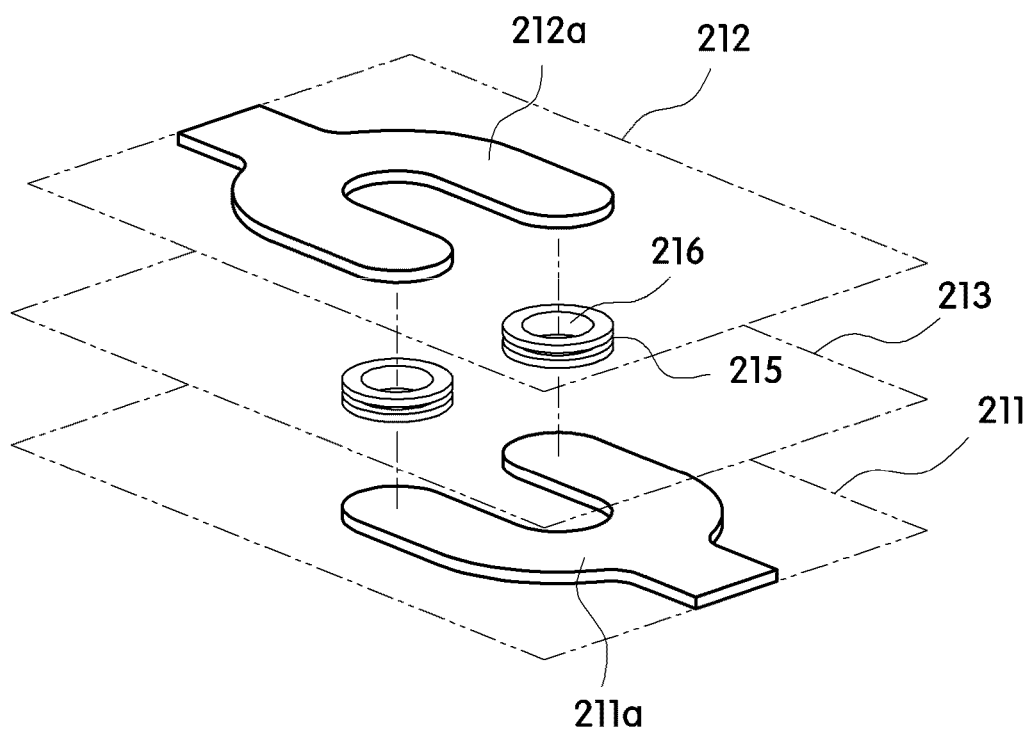

Also, as illustrated in FIG. 8, the first internal electrode 211a and the second internal electrode 212a are formed to have a substantially Y shape so that two portions thereof overlap. The air gap forming members 215 in which the discharge material layer is coated on the inner wall may be disposed in areas in which two portions overlap each other.

Figure 9:
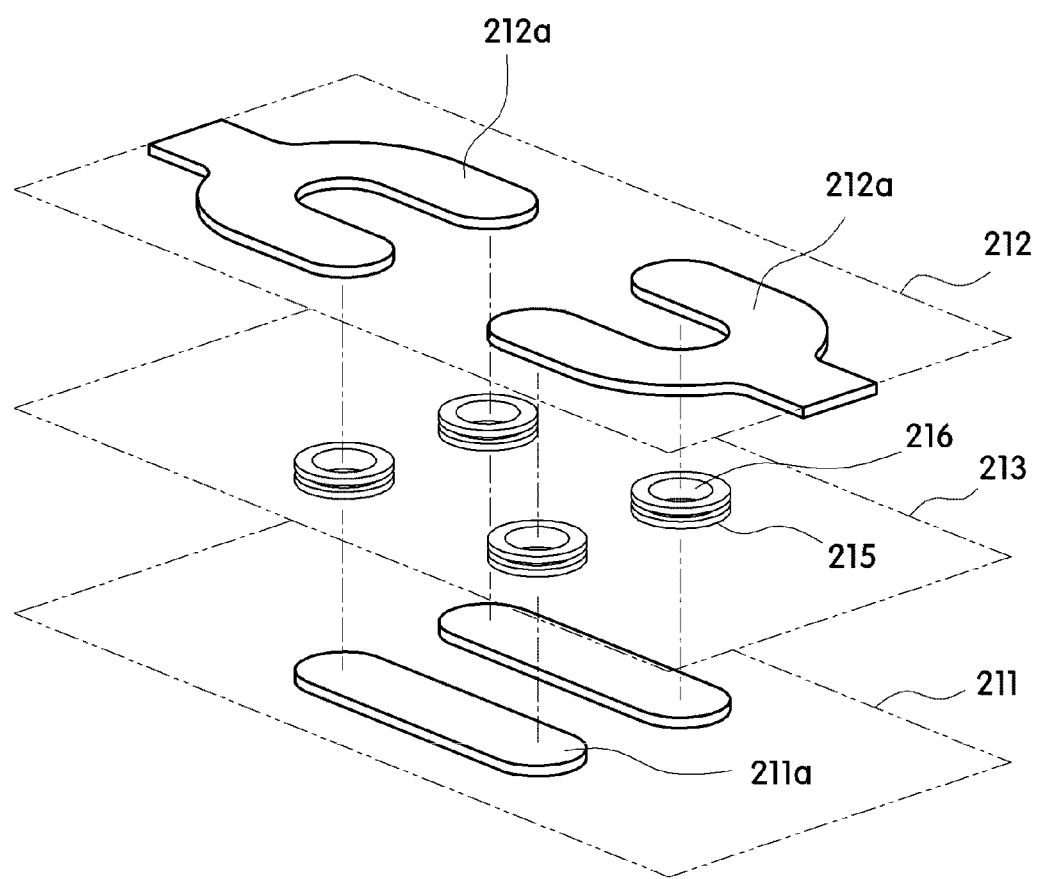

In addition, as illustrated in FIG. 9, two first internal electrodes 211a may be formed to have a bar shape having a predetermined length and two second internal electrodes 212a may be formed to have a substantially Y shape so that four portions thereof may be disposed to overlap. The air gap forming members 215 in which the discharge material layer is coated on the inner wall may be disposed at four overlap portions.

Figure 10:
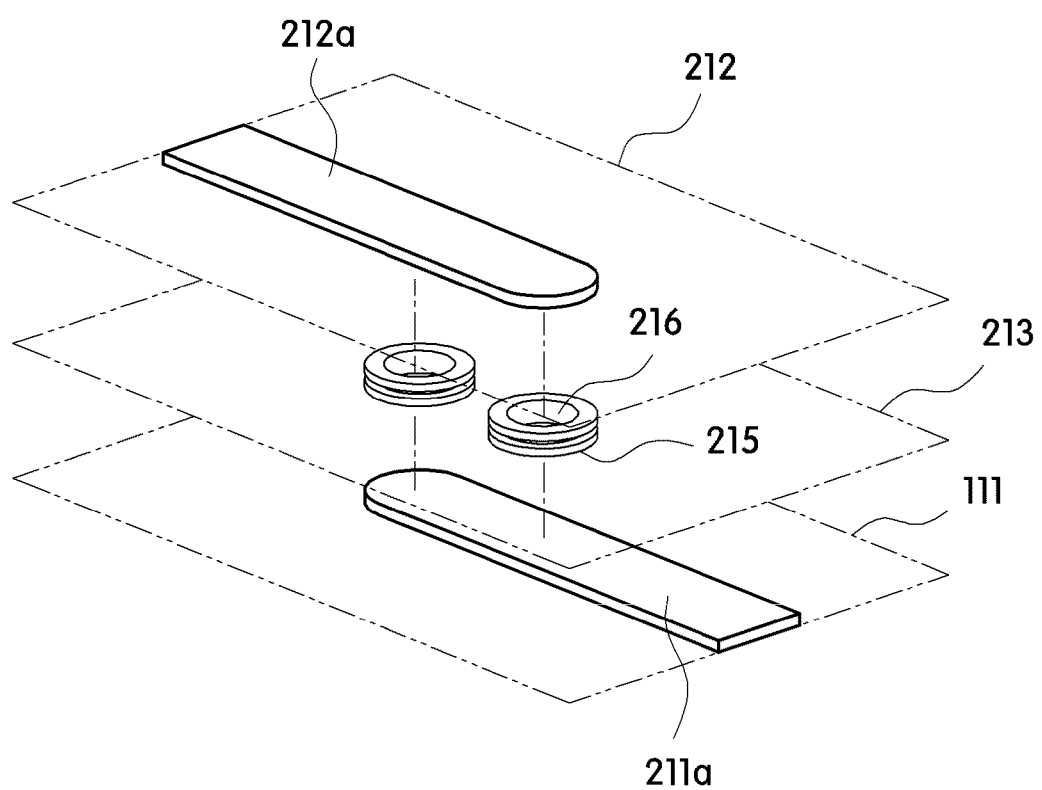

Also, as illustrated in FIG. 10, each of the first internal electrode 211a and the second internal electrode 212a may be formed to have a bar shape having a predetermined length. Two air gap forming members 215, in which the discharge material layer is coated on the inner wall, may be spaced a predetermined distance from each other in an overlapping portion thereof.

Figure 11:
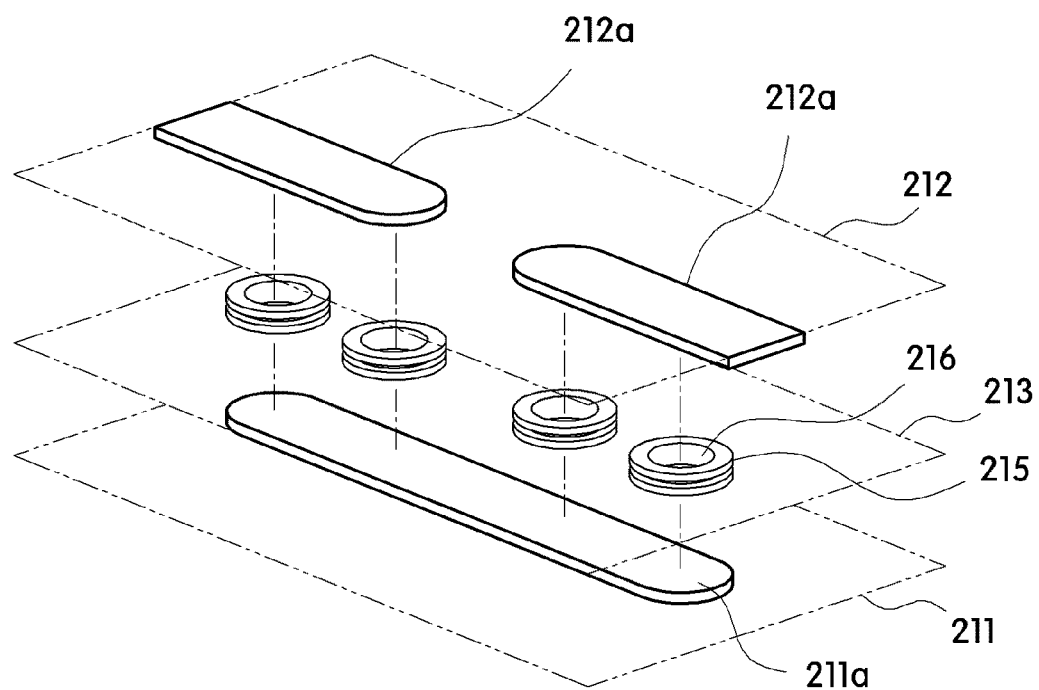

In addition, as illustrated in FIG. 11, the first internal electrode 211a may be formed to have a bar shape having a predetermined length, and two second internal electrodes 212a may be formed to have a bar shape having a predetermined length so that parts of the second internal electrodes 212a are disposed to overlap both ends of the first internal electrode 211a. The air gap forming member 215, on which two discharge material layers are coated, may be disposed in overlapping portions of the electrodes.

As described above, the first internal electrode 211a and the second internal electrode 212a may be provided in various shapes and patterns. It should be noted that the first internal electrode 211a and the second internal electrode 212a may partially overlap each other when the first internal electrode 211a and the second internal electrode 212a are stacked.

Figure 12:
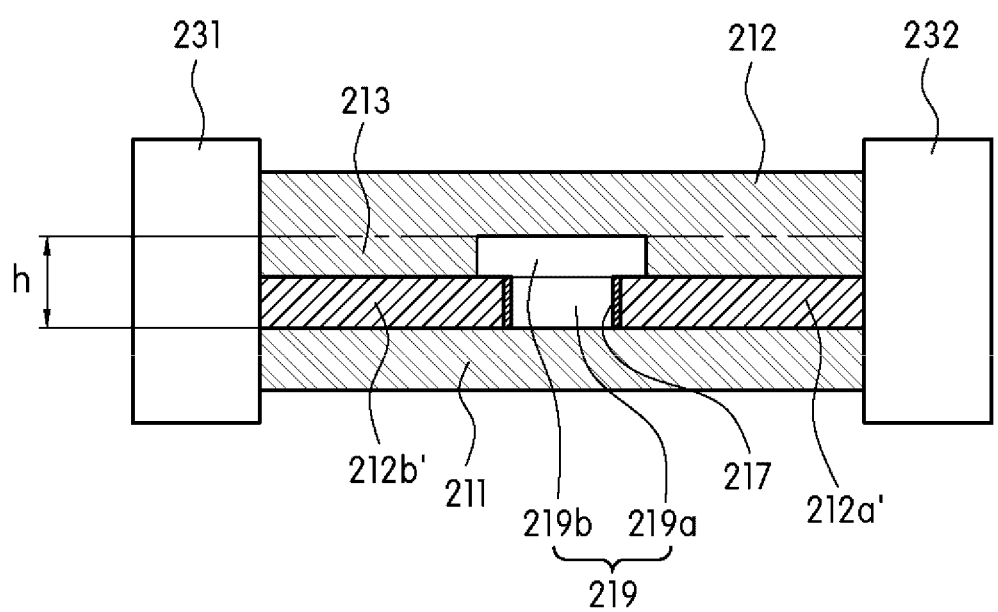
FIG. 12 is a longitudinal sectional view illustrating another example of the electric shock protection element that can be used in the portable electronic device with an embedded electric shock protection function according to one embodiment of the present invention.

FIG. 12 illustrates another example of an electric shock protection element that can be used when the electric shock protection element is provided as a suppressor in the portable electronic device 100 with an embedded electric shock protection function according to one embodiment of the present invention.

In an electric shock protection element 200, an air gap 219 may be formed between internal electrodes 212a' and 212b' without using a separate air gap forming element. In this case, a discharge material layer 217 may be provided at a side wall of the air gap 219.

The electric shock protection element 200 may include the pair of internal electrodes 212a' and 212b' horizontally disposed to be spaced a predetermined distance from each other.

In this case, the internal electrodes disposed to face each other may be provided to have various shapes and patterns, such as polygonal shape, a circular shape, an elliptical shape, a spiral shape, and combinations thereof. Also, the internal electrodes disposed to face each other may be provided to have the same pattern and shape, or may be provided to have different patterns and shapes.

Here, the air gap 219 may be formed between the pair of internal electrodes 212a' and 212b'. Here, the air gap 219 may be formed to have a height greater than a height of each of the pair of internal electrodes 212a' and 212b', and may be formed to have a width greater than a width of each of the pair of internal electrodes 212a' and 212b'. As described above, when a volume of the air gap 219 is enlarged, since a space between the internal electrodes 212a' and 212b' is wide even when fine particles are generated by the internal electrodes 212a' and 212b' during a static electricity discharge, an incidence rate of defects that can be caused by the particles may be reduced. In this case, the air gap is a space in which a discharge is started by the pair of internal electrodes 212a' and 212b' when static electricity is introduced thereto, and it is preferable for the volume of the air gap to be set to satisfy resistance to static electricity. For example, the volume of the air gap may range from 1 to 15% of a total volume of the electric shock protection element 200. Here, when the volume of the air gap is less than 1% of the total volume of the electric shock protection element 200, a short may occur between the pair of internal electrodes 212a' and 212b' and resistance to static electricity may be degraded. Also, when the volume of the air gap is more than 15% of the total volume of the electric shock protection element 200, the total volume of the electric shock protection element 200 may be increased, mechanical strength thereof may be lowered, and distortion or depression may occur due to deformation during a sintering process.

Specifically, the internal electrodes 212a' and 212b' are spaced apart from each other to form the air gap inside a sintered body made of at least a pair of each of the sheet layers 211, 212, and 213. Preferably, the pair of internal electrodes 212a' and 212b' are spaced the predetermined distance from each other in parallel directions on the same plane.

That is, the pair of internal electrodes 212a' and 212b' are spaced apart from each other to form a gap d on an upper surface of the first sheet layer 211. Here, a gap distance between the pair of internal electrodes 212a' and 212b' may range from 10 to 100 μm. The pair of internal electrodes 212a' and 212b' are pattern-printed on the upper surface of the first sheet layer 211.

In this case, the air gap 219 for protecting against static electricity, protecting the circuit protection element and peripheral circuits from an overvoltage, and blocking a leakage current is provided between the corresponding pair of internal electrodes 212a' and 212b'.

The air gap 219 is disposed between the pair of internal electrodes 212a' and 212b' disposed in parallel to each other on the same plane and is provided in a hollow form to be filled with air. The second sheet layer 212 is stacked on an open upper side of the air gap 219.

A plurality of air gaps 219 may be provided and spaced apart from each other in width directions of the internal electrodes 212a' and 212b'. As described above, when the number of the air gaps 219 increases, the number of discharge paths of static electricity may increase so that resistance to static electricity may be improved.

In this case, the air gaps 219 are formed to have a height greater than a height from the upper surface of the first sheet layer 211 to upper ends of the internal electrodes 212a' and 212b'. That is, the air gaps 219 are provided to have a height greater than a total height of the internal electrodes 212a' and 212b' so that the total volume of the air gap 219 may be increased.

Accordingly, even when fine particles are generated by the internal electrodes 212a' and 212b' during a static electricity discharge, an incidence rate of defects that can be caused by the particles may be reduced due to the air gaps 219 having a large space.

In this case, a first part of the air gap 219 may be provided to extend on the upper surface of at least one of the pair of internal electrodes 212a' and 212b' spaced apart from each other, and may extend over the entire upper surfaces of the pair of internal electrodes 212a' and 212b'.

Here, the air gap 219 includes a first part 222a having the same height as the internal electrodes 212a' and 212b', and a second part which extends to a predetermined height from an upper end of the first part 222a.

In addition, the air gap 219 may include a third part which extends downward to a predetermined height from a lower end of the first part, and the third part may extend on the lower surface of the internal electrodes 212a' and 212b'.

In this case, when the third part is included in the air gap 219, a separate accommodation groove for accommodating the third part may be recessed downward to a predetermined depth from the upper surface of the first sheet layer 211 on the upper surface of the first sheet layer 211.

The air gap 219 is formed by removing an air gap material by applying heat in a sintering process after the air gap material is pattern-printed on a gap. Here, the air gap material is used to prevent deformation of or damage to the air gap 219 by pressure in a process of pressing the air gap material to form the sintered body after the first sheet layer 211 and the second sheet layer 212 are stacked.

To this end, the air gap material is made with a material that can be decomposed by a high temperature heat so that the air gap material may be removed in a sintering processing of a plurality of sheet layers after the plurality of sheet layers are stacked. For example, the air gap material may be made of a material which is decomposed at a temperature ranging from 200 to 2,000° C.

Also, in the portable electronic device 100 with an embedded electric shock protection function according to one embodiment of the present invention, when an electric shock protection part of each of the electric shock protection elements 200, 200', 300, 300', 400, and 400' is provided as a suppressor, the capacitors 220a and 220b may be stacked on at least one of upper and lower portions of the electric shock protection part to increase capacitance thereof.

Figure 13:
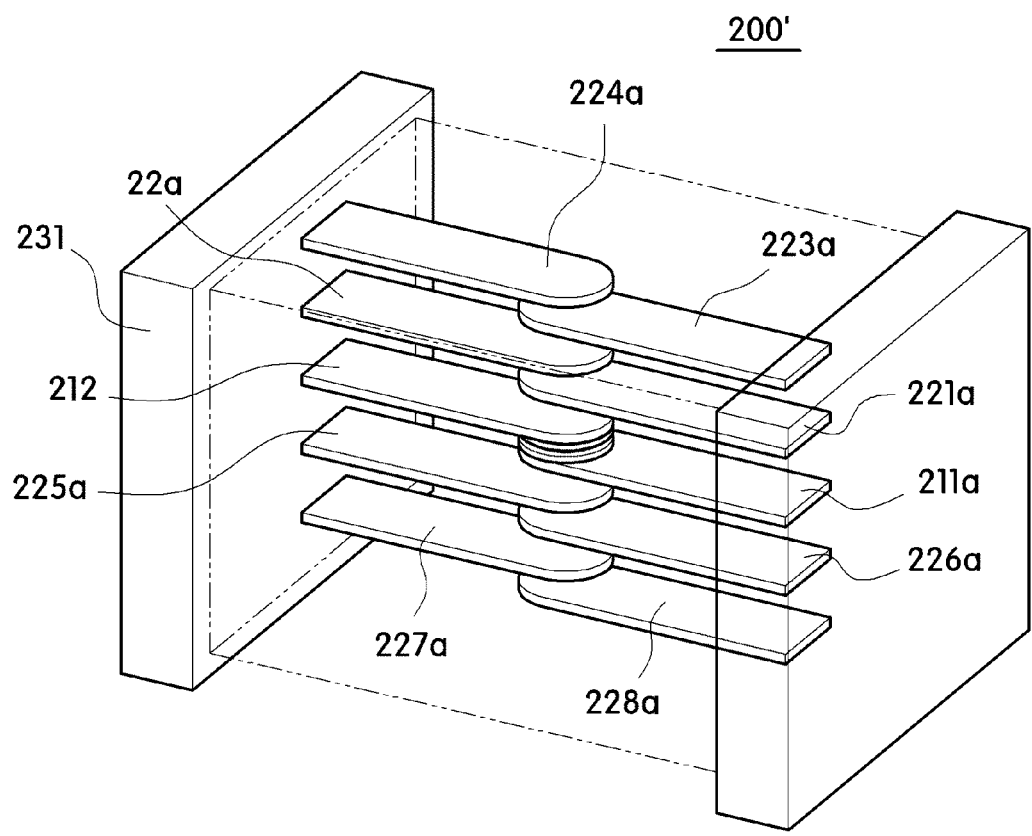
FIG. 13 is an overall perspective view illustrating a state in which capacitors are stacked as an example of the electric shock protection element that can be used in the portable electronic device with an embedded electric shock protection function according to one embodiment of the present invention.
Figure 14:
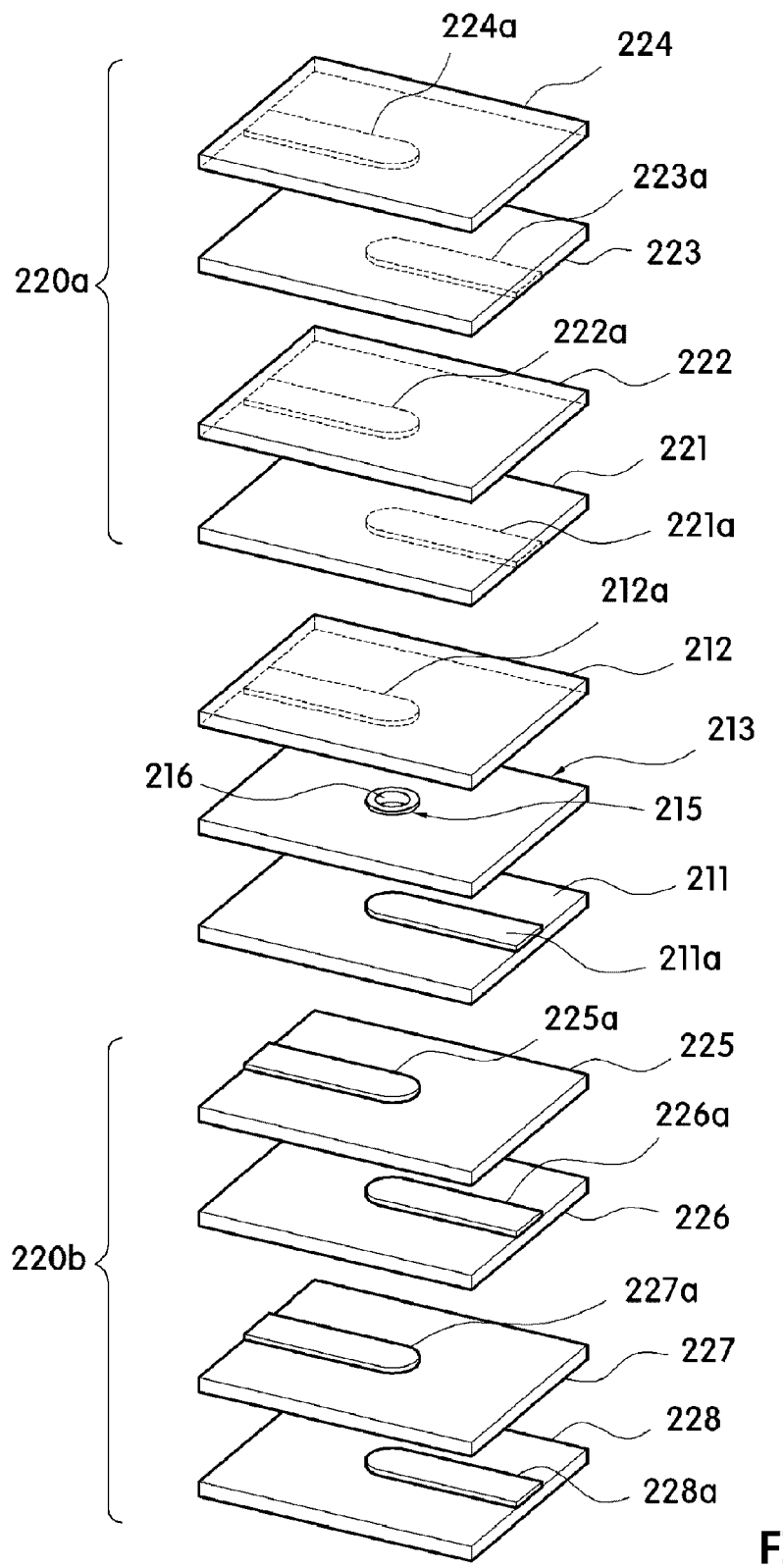
FIG. 14 is an exploded perspective view illustrating a stacking relationship of a plurality of sheet layers in FIG. 13.
Figure 15:
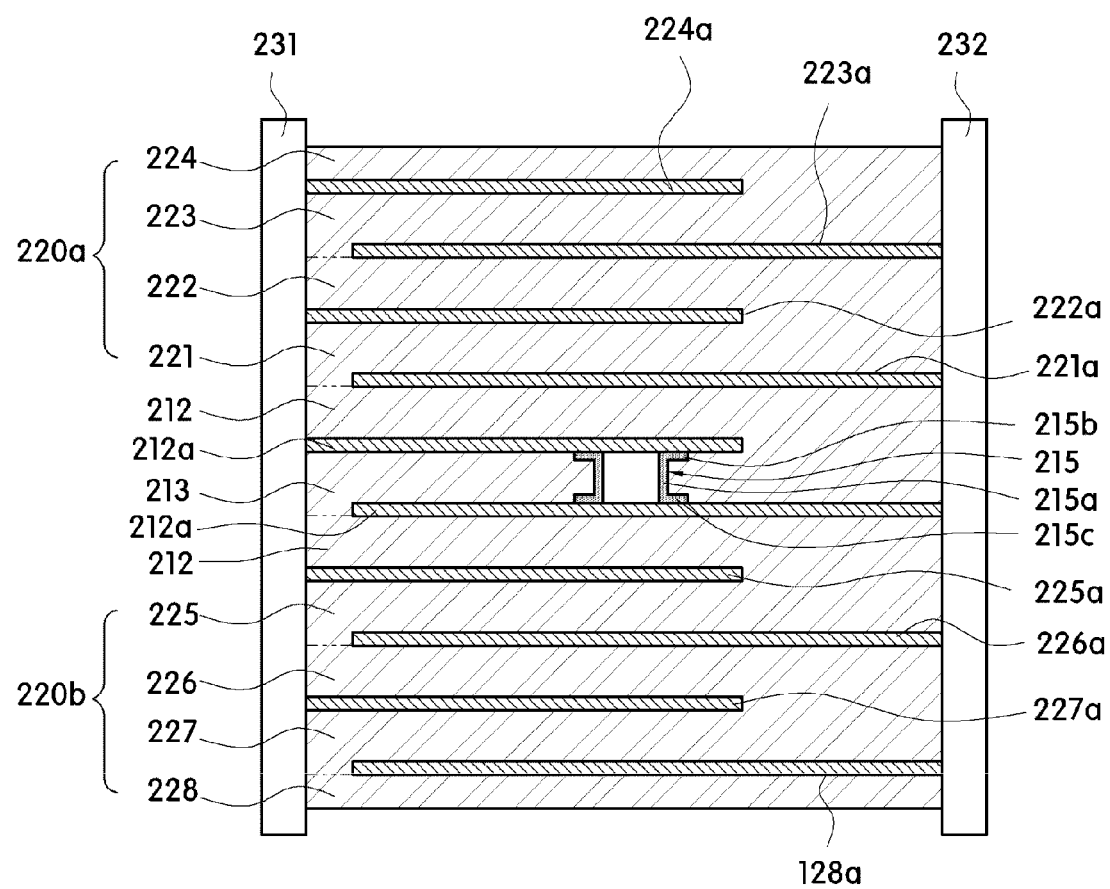
FIG. 15 is a longitudinal sectional view illustrating the plurality of sheet layers of FIG. 13.

That is, as illustrated in FIGS. 13 to 15, the electric shock protection element 200' may include the capacitors 220a and 220b for increasing the capacitance, and a plurality of sheet layers 221, 222, 223, 224, 225, 226, 227, and 228 are stacked on at least one of a lower portion of the first sheet layer 211 or an upper portion of the second sheet layer 212.

In this case, the electric shock protection element 200 and the capacitors 220a and 220b are formed by stacking a plurality of sheet layers 211, 212, 213, 221, 222, 223, 224, 225, 226, 227, and 228.

Here, the sheet layers 211, 212, 213, 221, 222, 223, 224, 225, 226, 227, and 228 may be made with an insulator having permittivity. For example, an LTCC, an HTCC, a magnetic material, or the like may be used.

That is, a plurality of sheet layers 211, 212, 221, 222, 223, 224, 225, 226, 227, and 228 having electrodes 211a, 212a, 221a, 222a, 223a, 224a, 225a, 226a, 227a, and 228a respectively provided on one surfaces thereof are sequentially stacked, the plurality of electrodes 211a, 212a, 221a, 222a, 223a, 224a, 225a, 226a, 227a, and 228a respectively provided on the surfaces thereof are disposed to face each other, and the electric shock protection element 200 and the capacitors 220a and 220b are then integrally formed through a pressing process and a sintering process.

Here, the capacitors 220a and 220b stacked on at least one of the upper and lower portions of the electric shock protection element 200 may provide a capacitance thereof to increase RF reception sensitivity.

To this end, the capacitors 220a and 220b are formed by stacking at least one of the sheet layers 221, 222, 223, 224, 225, 226, 227, and 228 having the electrode 221a, 222a, 223a, 224a, 225a, 226a, 227a, or 228a provided on one surface thereof, are stacked on at least one of the upper and lower portions of the electric shock protection element 200, and are connected in parallel to the electric shock protection element 200 with respect to the external electrodes 231 and 232.

In this case, the capacitors 220a and 220b may be formed as a single sheet layer having an electrode provided on one side thereof and stacked on the electric shock protection element 200, but the plurality of sheet layers may be stacked to provide a high capacitance to allow an RF signal to pass therethrough smoothly.

Here, the number of sheet layers 221, 222, 223, 224, 225, 226, 227, and 228 constituting the capacitors 220a and 220b may be appropriately provided in accordance with capacitance. As the number of the stacked sheet layers 221, 222, 223, 224, 225, 226, 227, and 228 increases, total capacitance is increased by the capacitors 220a and 220b being connected in parallel to the electric shock protection element 200 with respect to the external electrodes 131 and 132.

Therefore, when the conductor is applied to a portable terminal used as a radiator of an antenna, the capacitors 220a and 220b are connected in parallel to the electric shock protection element 200 with respect to the external electrodes so that the electric shock protection element 200 may protect against static electricity and the capacitors 220a and 220b having a high capacitance may prevent lowering of RF reception sensitivity of the antenna.

Accordingly, unlike the related art in which a separate part for increasing RF reception sensitivity is used with a suppressor, a varistor, or a Zener diode for protecting a circuit from static electricity, protecting against static electricity and increasing RF reception sensitivity may be performed through one electric shock protection element 100.

As illustrated in FIG. 15, the capacitors 220a and 220b may include the first capacitor 220a and the second capacitor 220b formed by stacking the same number of the plurality of sheet layers 221, 222, 223, 224, 225, 226, 227, and 228 on the lower portion of the first sheet layer 211 and the upper portion of the second sheet layer 212, which are included in the electric shock protection element 200.

In this case, electrodes connected to the external electrodes 231 and 232 are provided on one surface of each of the sheet layers 221, 222, 223, 224, 225, 226, 227, and 228 disposed below the first sheet layer 211 and above the second sheet layer 212. Accordingly, the first capacitor 220a and the second capacitor 220b having the same capacitance are symmetrically disposed on an upper side and a lower side with respect to the protective sheet layer 213.

In addition, the air gap 216 formed in the protective sheet layer 213 is also formed in a central portion of the protective sheet layer 213 so that the capacitors 220a and 220b may be upwardly, downwardly, leftwardly, and rightwardly symmetrical with respect to the air gap 216.

Meanwhile, the capacitors 220a and 220b may be stacked around the electric shock protection element 200 in various manners.

Figure 16:
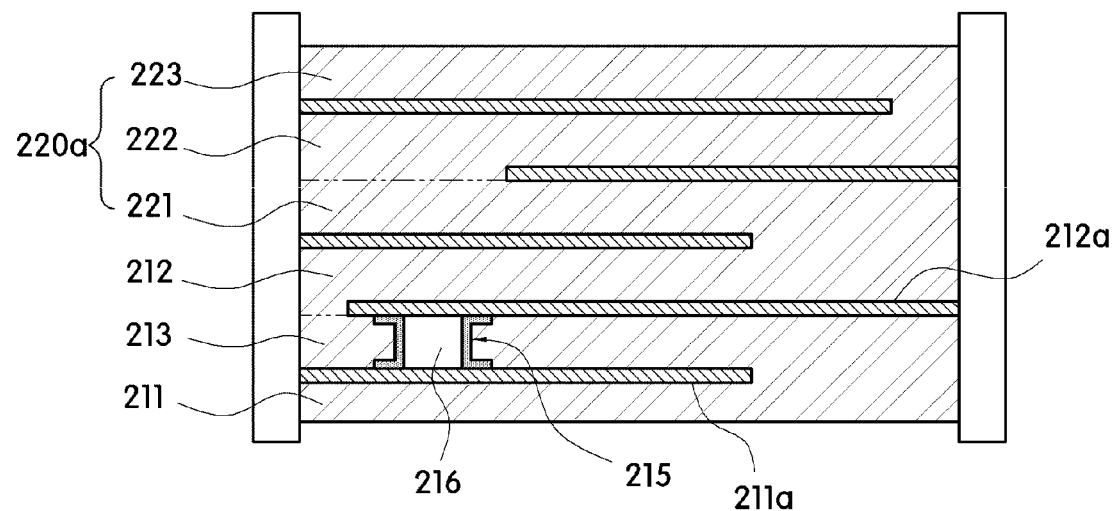
FIGS. 16 to 19 are longitudinal sectional views illustrating various arrangement relationships of an electric shock protection part and capacitors when the capacitors are stacked as an example of the electric shock protection element that can be used in the portable electronic device with an embedded electric shock protection function according to one embodiment of the present invention.
Figure 17:
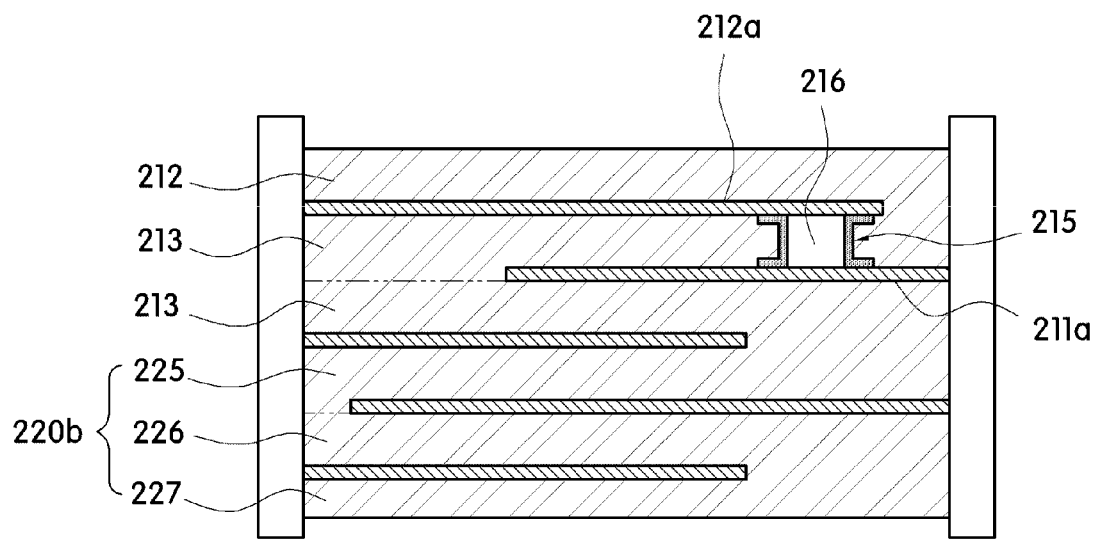

That is, the capacitors 220a and 220b may be formed by stacking the plurality of sheet layers 221, 222, 223, 224, 225, and 226 only on the upper portion of the second sheet layer 212 (see FIG. 16) or only on the lower portion of the first sheet layer 211 (see FIG. 17).

Figure 18:
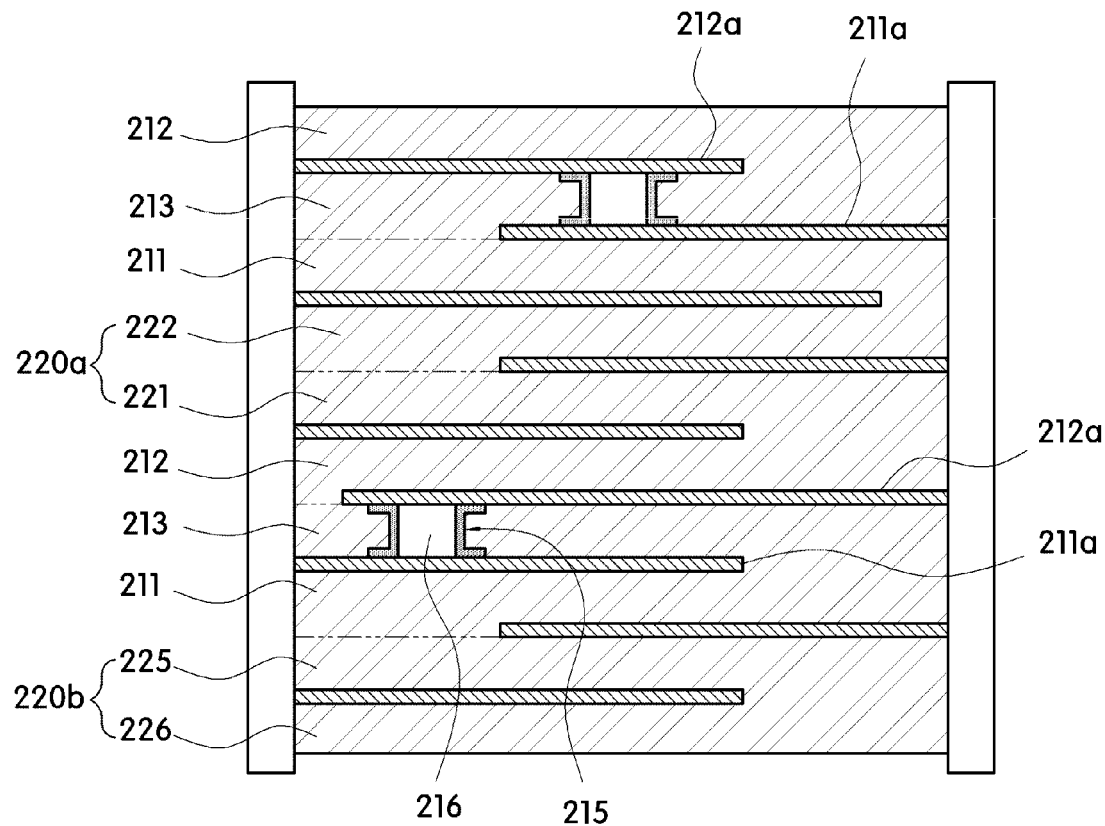
Figure 19:
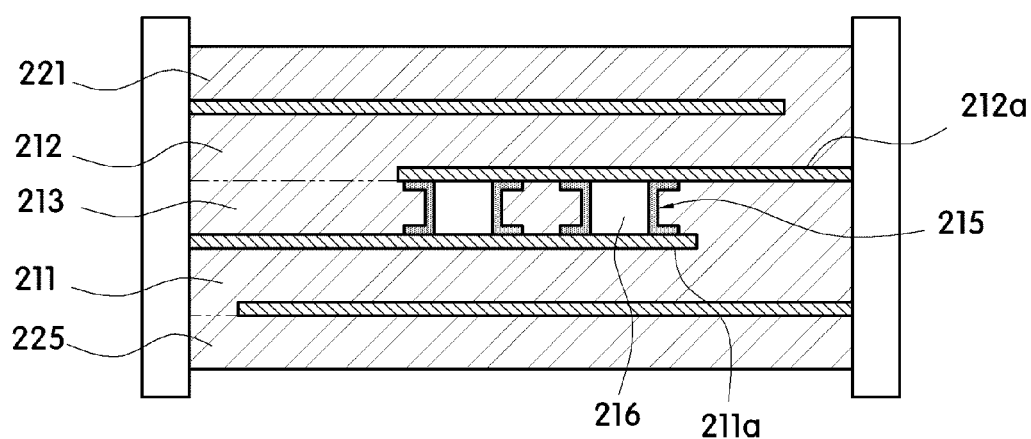

In addition, as illustrated in FIG. 18, a plurality of electric shock protection elements 200 may be provided, the capacitors 220a and 220b may be disposed between the plurality of electric shock protection elements 200, the two capacitors 220a and 220b may be symmetrically disposed with respect to the electric shock protection elements 200, and a plurality of air gaps 216 may be provided in the electric shock protection elements 200.

That is, it should be noted that a plurality of capacitors may be symmetrically or asymmetrically provided with respect to the electric shock protection element 200, and the plurality of electric shock protection elements 200 may be disposed between the plurality of capacitors.

In addition, it should be noted that the number of the capacitors 220a and 220b which constitute the electric shock protection element and the number of the electric shock protection elements 200 are not limited, and various numbers of the capacitors 220a and 220b and the electric shock protection elements 200 may be provided according to a desired capacitance, and a stacking relationship of the electric shock protection element 200 and the capacitors 220a and 220b may also be variously changed.

FIGS. 20 to 27 illustrate examples of an electric shock protection element that can be used when the electric shock protection elements 200, 200', 300, 300', 400, and 400' are provided in the form of a varistor in the portable electronic device 100 with an embedded electric shock protection function according to one embodiment of the present invention.

Figure 20:
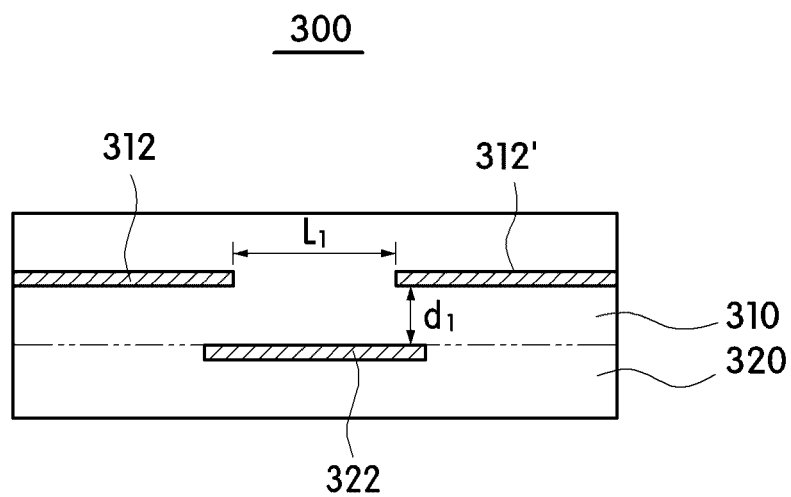
FIG. 20 is a cross-sectional view illustrating another example of the electric shock protection element that can be used in the portable electronic device with an embedded electric shock protection function according to one embodiment of the present invention.
Figure 21:
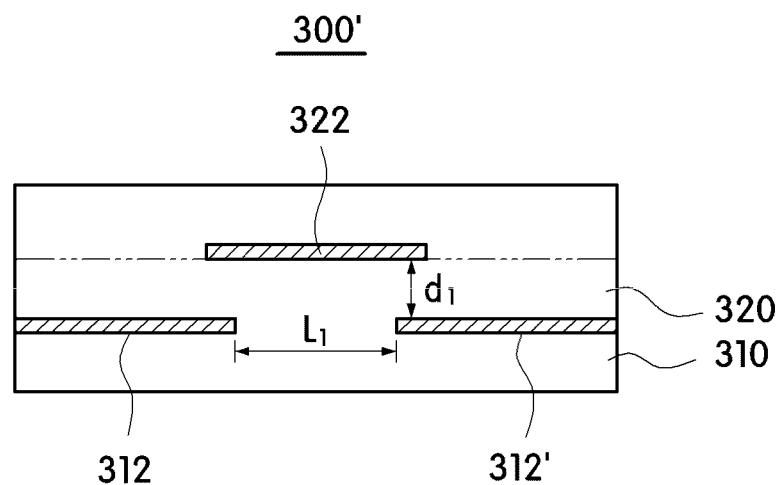
FIGS. 21 to 27 are views illustrating various forms of the electric shock protection element in FIG. 20.

That is, as illustrated in FIGS. 20 and 21, the electric shock protection elements 300 and 300' may include a first varistor material layer 310, a second varistor material layer 320, and internal electrodes 312, 312', and 322.

The first varistor material layer 310 and the second varistor material layer 320 may be made of a varistor material and may be, for example, a sheet layer manufactured using a semiconductive material such as $ZnO$, $SrTiO_3$, $BaTiO_3$, $SiC$, or the like, or Pr and Bi based materials. The first varistor material layer 310 and the second varistor material layer 320 may be vertically stacked. In this case, it is preferable for the first varistor material layer 310 and the second varistor material layer 320 to be set so that a particle diameter of the varistor material satisfies the breakdown voltage Vbr.

The internal electrodes may include a plurality of first internal electrodes 312 and 312' spaced a predetermined distance $L_1$ from each other on the first varistor material layer 310 and a plurality of second internal electrodes 322 spaced the predetermined distance $L_1$ from each other on the second sheet 320.

Here, the breakdown voltage Vbr of the electric shock protection element 300 may be a sum of unit breakdown voltages formed between the second internal electrode 322 and each of the nearest first internal electrodes 312 and 312'. That is, the breakdown voltage Vbr of the varistor 100 may be determined by the unit breakdown voltages formed between the second internal electrode 322 and each of the first internal electrodes 312 and 312', and the numbers of the first internal electrodes 312 and 312' and the second internal electrodes 322 which are electrically connected in series.

In this case, the first internal electrodes 312 and 312' and the second internal electrode 322 may have a thickness of 2 to 10 µm. Here, when the thickness of each of the first internal electrodes 312 and 312' and the second internal electrode 322 is less than 2 µm, the first internal electrodes 312 and 312' and the second internal electrode 322 may not serve as internal electrodes. When the thickness of each of the first internal electrodes 312 and 312' and the second internal electrode 322 is more than 10 µm, securing of a distance between the internal electrodes is limited such that the thickness of each of the internal electrodes or the varistor material layers disposed in parallel may be increased, a total size of the electric shock protection element 100 may be increased, and miniaturization may be adversely affected.

Each of the first internal electrodes 312 and 312' and the second internal electrode 322 may be disposed so that at least a part thereof does not overlap the other electrodes. That is, each of the first internal electrodes 312 and 312' and the second internal electrode 322 may be alternately disposed so that at least a part thereof overlaps the other electrodes or may be alternately disposed between the other electrodes so that at least a part thereof does not overlap the other electrodes.

In this case, it is preferable for a distance between the first internal electrode and the second internal electrode to be set so that static electricity or a leakage current does not leak to external electrodes (not illustrated) adjacent to the internal electrodes 312, 312' and 322 and the static electricity or the leakage current normally proceeds between the internal electrodes 312, 312' and 322.

For example, it is preferable for a distance $L_1$ between one of the first internal electrodes 312 and 312' and the second internal electrode 322 adjacent thereto to be greater than a shortest distance $d_1$ between the first internal electrodes 312 and 312' and the second internal electrode 322.

In addition, it is preferable for a distance between the second internal electrode 322 and an adjacent external electrode (not illustrated) to be greater than a distance between the first internal electrodes 112 and 122. Here, it should be noted that, although not illustrated, the external electrodes are disposed at both ends of each of the internal electrodes 312 and 322 like those in FIG. 4.

Specifically, the first varistor material layer 310 may include the two first internal electrodes 312 and 312', and the two first internal electrodes 312 and 312' may be spaced apart from each other in parallel on the same plane.

Also, the second sheet 320 may include the second internal electrode 322 on one surface thereof.

In this case, the first varistor material layer 310 and the second sheet 320 are vertically stacked so that the second internal electrode 322 may be spaced a predetermined distance from the two first internal electrodes 312 and 312' in a vertical direction.

In addition, the second internal electrode 322 may be disposed so that both end sides thereof partially overlap one end side of each of the two first internal electrodes 312 and 312'. To this end, a central portion of the second internal electrode 322 may be disposed at a central portion of a gap $L_1$ formed between the two first internal electrodes 312 and 312'.

Here, the first varistor material layer 310 in which the two first electrodes 312 and 312' are formed may be stacked on an upper portion of the second varistor material layer 320 in which the one second electrode 322 is formed (see FIG. 20), or on a lower portion of the second varistor material layer 320 (see FIG. 21).

FIGS. 22 to 27 illustrate various implementation examples of an electric shock protection element that can be used when the electric shock protection element according to the embodiment of the present invention is a varistor.

The electric shock protection element 400 may include a plurality of unit elements formed by the first internal electrodes 312 and 312' and the second internal electrode 322 in parallel.

Figure 22:
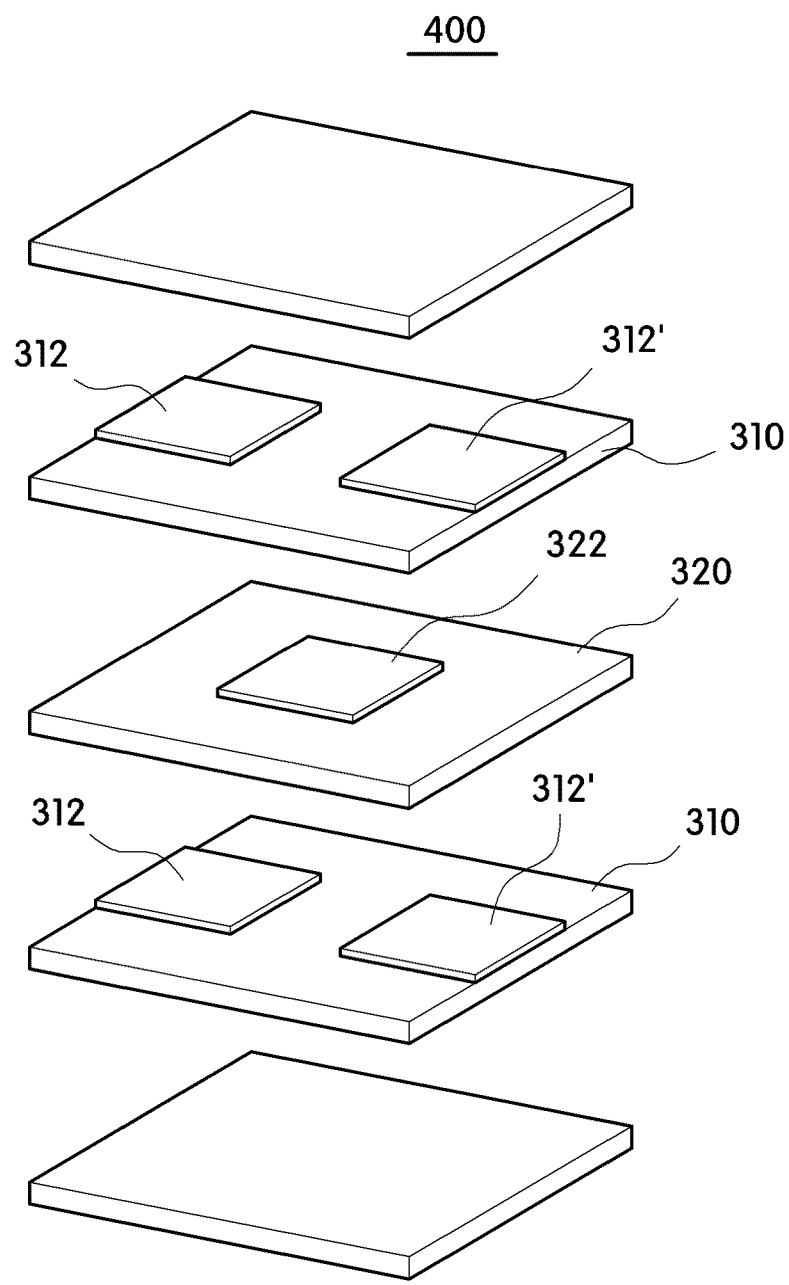
Figure 23:
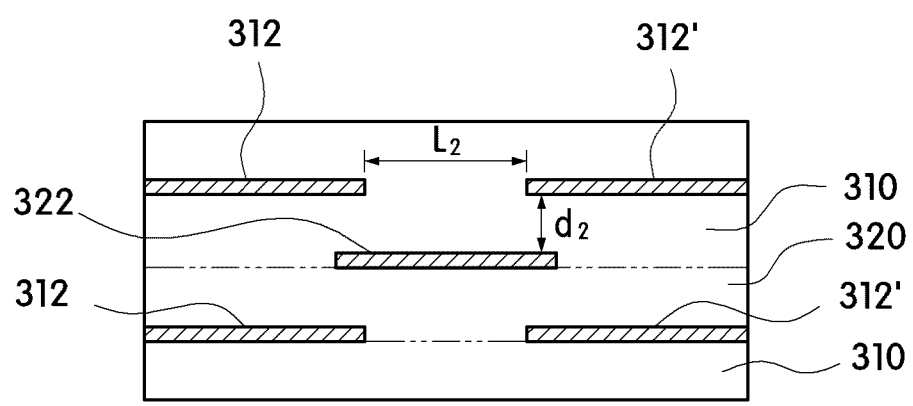

That is, as illustrated in FIGS. 22 and 23, the electric shock protection element 400 may be formed by alternately stacking two first varistor material layers 310 in which two first internal electrodes 312 and 312' are formed and one second varistor material layer 320 in which one second internal electrode 322 is formed.

In this case, the two first varistor material layers 310 may be stacked on upper and lower portions of the second varistor material layer 320, respectively. Here, the second internal electrode 322 formed on the second varistor material layer 320 is disposed such that both end sides thereof overlap an area of one end side of each of the first internal electrodes 312 and 312' disposed on the upper portion of the second varistor material layer 320 and an area of one end side of the second internal electrode 322 disposed on the lower portion of the second varistor material layer 320.

Also, the first internal electrodes 312 and 312' disposed on the upper portion of the second varistor material layer 320 and the first internal electrodes 312 and 312' disposed on the lower portion of the second varistor material layer 320 may be vertically disposed in parallel, and the second internal electrode 322 may be disposed between the first internal electrodes 312 and 312' spaced apart from each other in a vertical direction.

In this case, a central portion of the second internal electrode 322 may be disposed at a central portion of a gap $L_1$ formed between the two first internal electrodes 312 and 312' disposed on the same plane.

The first varistor material layer 310 and the second varistor material layer 320 may be disposed in various stacking orders while satisfying a gap $d_1$ between the first internal electrodes 312 and 312' and the second internal electrode 322 or a distance $L_1$ therebetween as described above.

As described above, as a plurality of first varistor material layers 310 and a plurality of second varistor material layers 320 are stacked, the number of discharge paths of the static electricity may increase such that resistance to static electricity can be improved.

Figure 24:
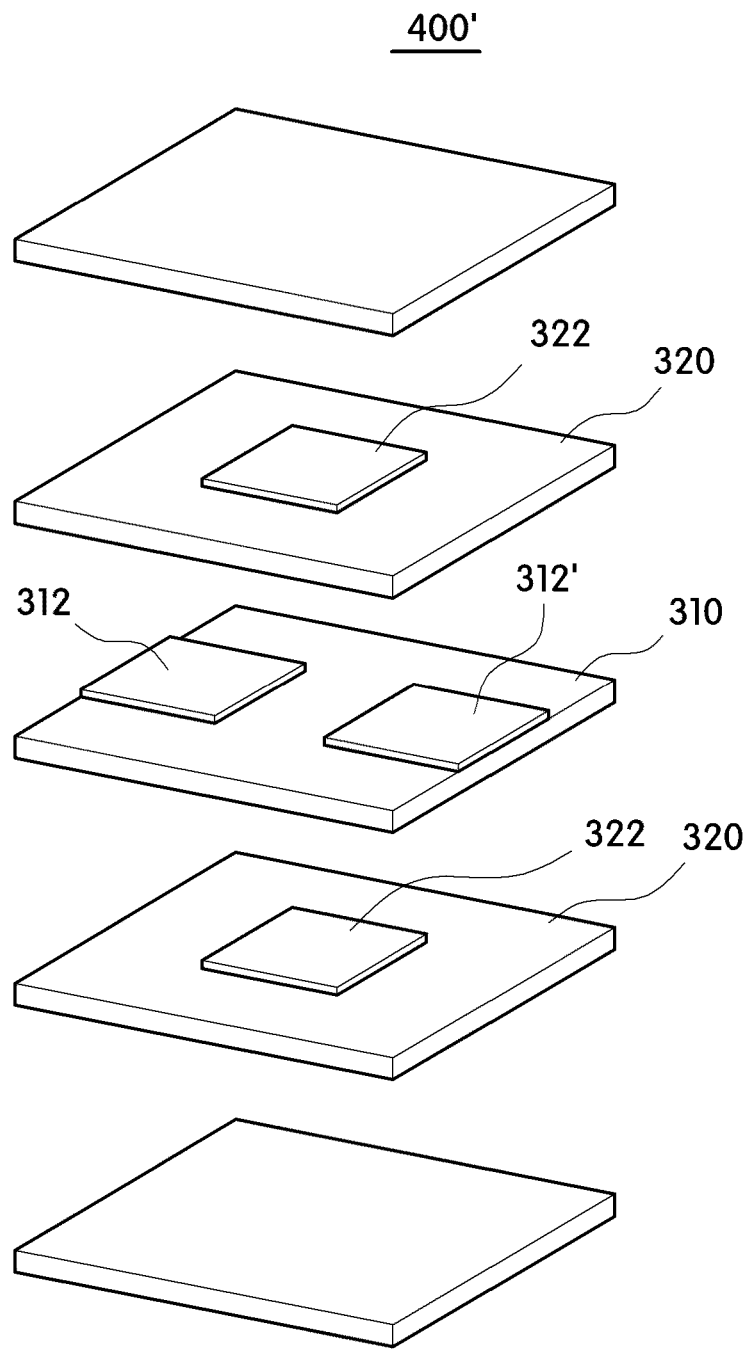
Figure 25:
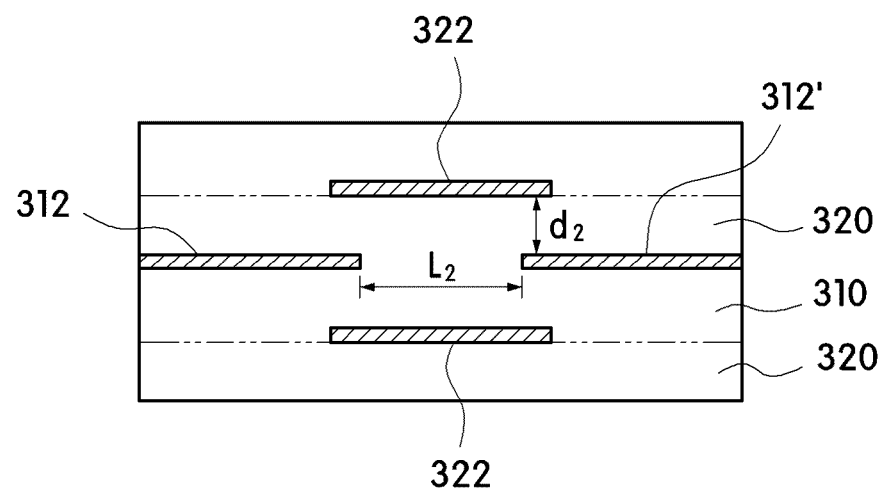

As another example, as illustrated in FIGS. 24 and 25, the electric shock protection element 400' may be formed by alternately stacking one first varistor material layer 310 in which two first internal electrodes 312 and 312' are formed and two second varistor material layers 320 in which one second internal electrode 322 is formed.

In this case, the two second varistor material layers 320 may be stacked on upper and lower portions of the first varistor material layer 310, respectively.

Here, the second internal electrode 322 formed on the second varistor material layer 320 may be disposed at a position at which both end sides thereof overlap the pair of first internal electrodes 312 and 312' spaced apart from each other on the upper and lower portions of the second varistor material layer 320.

In this case, it is preferable for a distance between the second internal electrode 322 and each of the first internal electrodes 312 and 312' to be set so that static electricity or a leakage current does not leak to an external electrode (not illustrated) and the static electricity or the leakage current normally proceeds between the first internal electrodes 312 and 312'. For example, it is preferable for a distance between the second internal electrode 322 and the external electrode (not illustrated) adjacent thereto to be greater than a gap $d_1$ between the first internal electrodes 312 and 312'.

Figure 26:
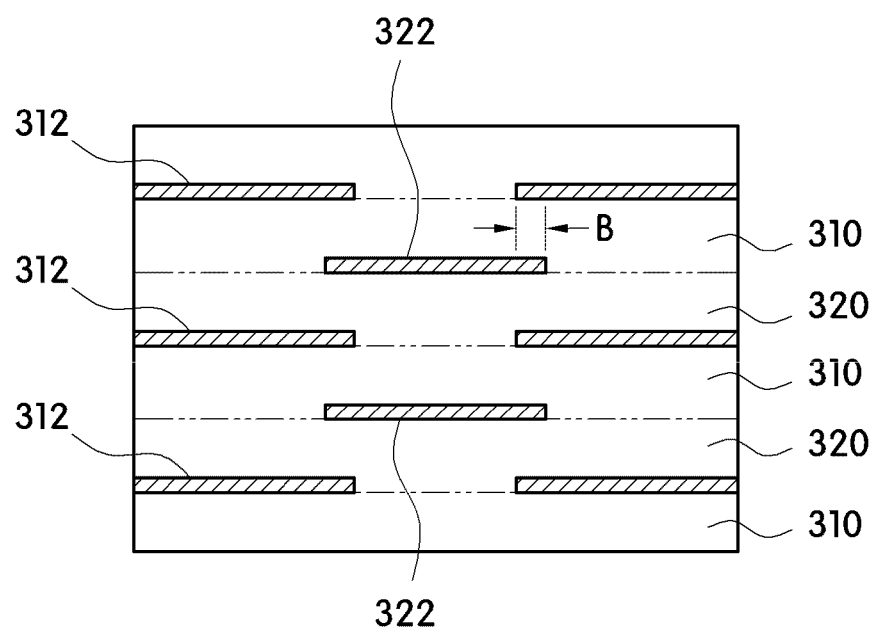
Figure 27:
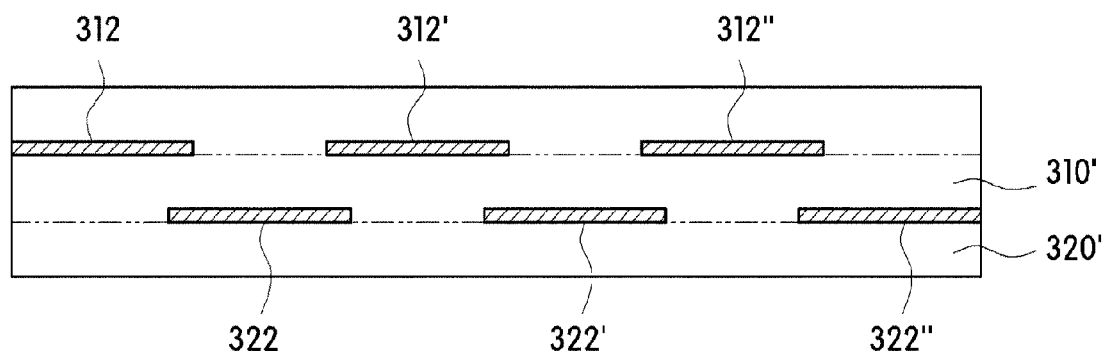

As still another example, as illustrated in FIGS. 26 and 27, the electric shock protection element 400' may include a plurality of unit elements formed by the first internal electrodes 312 and 312' and the second internal electrode 322 in parallel or in series.

That is, a plurality of first varistor material layers 310 and a plurality of second varistor material layers 320 are alternately stacked in a vertical direction. In this case, in consideration of limitations on a distance between the internal electrodes 312, 312' and 322 and external electrodes (not illustrated), it is preferable for an uppermost layer and a lowermost layer to be stacked such that internal electrodes connected to the external electrodes (not illustrated) are disposed. For example, as illustrated in FIG. 26, the first internal electrode 312 connected to the external electrode (not illustrated) may be disposed on the uppermost layer and the lowermost layer.

As described above, in the electric shock protection element 400', as the plurality of first varistor material layers 310 and the plurality of second varistor material layers 320 are stacked, the number of discharge paths of static electricity may increase such that resistance to static electricity can be improved.

Meanwhile, the number of the first internal electrodes 312 and 312' and second internal electrodes 322 may be determined according to a unit breakdown voltage formed therebetween so that the breakdown voltage Vbr of the electric shock protection element 400' is satisfied. That is, as illustrated in FIG. 27, the first varistor material layer 310', in which a plurality of first internal electrodes 312, 312', and 312" are spaced apart from each other in parallel in a horizontal direction on the same plane, and a second varistor material layer 320', in which a plurality of second internal electrodes 322, 322', and 322" are spaced apart from each other in parallel in the horizontal direction on the same plane, may be stacked.

In this case, the plurality of adjacent first internal electrodes 312, 312', and 312" are disposed between the plurality of second internal electrodes 322, 322', and 322" disposed above or below the plurality of second internal electrodes 322, 322', and 322", and a part thereof may be disposed to overlap a part of the second internal electrodes 322, 322', and 322".

FIGS. 28 to 33 illustrate various forms of the conductive connecting part 160 that can be used in the portable electronic device with an embedded electric shock protection function according to one embodiment of the present invention.

Figure 28:
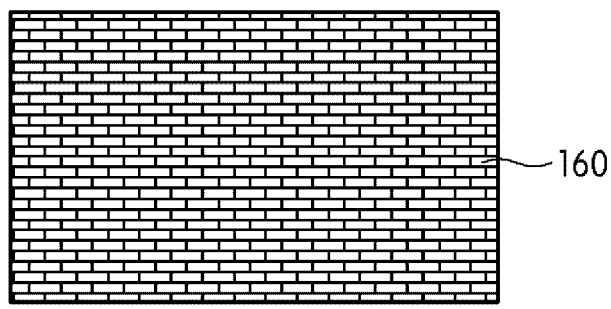
FIGS. 28 to 33 are views illustrating various forms of a conductive connecting part that can be used in the portable electronic device with an embedded electric shock protection function according to one embodiment of the present invention.

As illustrated in FIG. 28, the conductive connecting part 160 may be a conductive gasket. Here, the conductive gasket 160 may be integrally formed with a conductive material having an elastic force. The conductive gasket 160 may include, for example, at least one of a polymer body, a natural rubber, a sponge, a synthetic rubber, a foam, a heat-resistant silicon rubber, and a tube, formed by thermocompression bonding of a conductive paste. The conductive gasket 160 is not limited thereto, and may include a conductive material having an elastic force.

An upper portion of the conductive gasket 160 comes into surface contact with the conductor 120 such as the conductive cover 132. The conductive gasket 160 may be mounted on the circuit board 140 to be electrically connected in series to the electric shock protection elements 200, 300, and 400.

Figure 29:
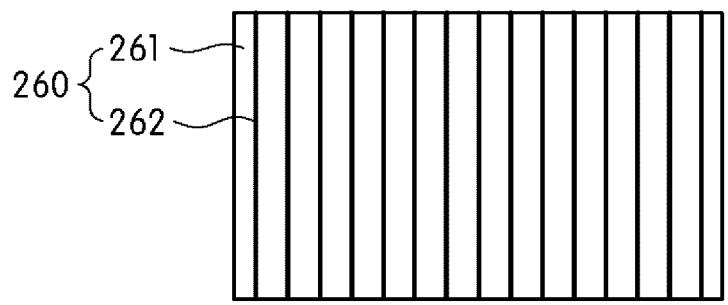

As illustrated in FIG. 29, in the case in which the conductive connecting part is a box-shaped silicon rubber pad 260, the silicon rubber pad includes a body 261 and a conductive wire 262.

The body 261 may be made of a silicon rubber, and an upper portion of the body 261 comes into surface contact with the conductor 120 such as the conductive cover 132. The body 261 may be mounted on the circuit board 140 to be electrically connected to the electric shock protection elements 200, 300, and 400.

The conductive wire 262 may be vertically formed inside the body 261. The conductive wire 262 is intended to improve electrical contact with the conductive cover 132 and to complement an elastic force of the body 261.

For example, an upper end of the conductive wire 262 is bent downward when the conductive wire 262 is pressed by the conductive cover 132, and the upper end of the conductive wire 262 is restored to an original vertical state thereof when the conductive cover 132 is removed such that the elastic force of the body 261 may be compensated.

Figure 30:
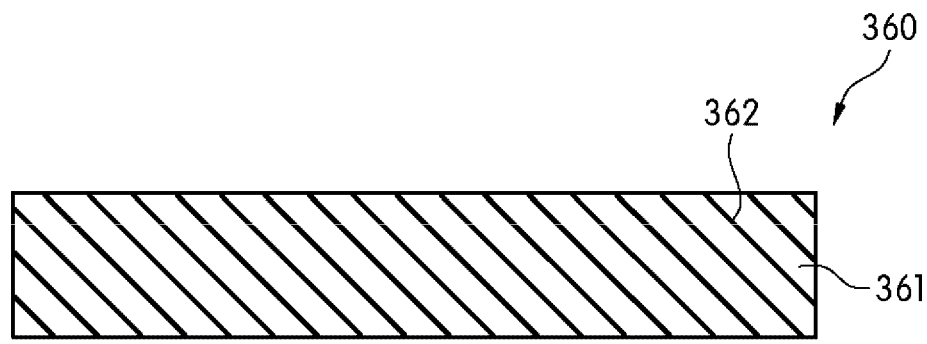

As illustrated in FIG. 30, in the case in which the conductive connecting part is a silicon rubber pad 360, the silicon rubber pad 360 includes a body 361 and a conductive wire 362.

The body 361 may be made of a silicon rubber, and an upper portion of the body 361 comes into surface contact with the conductor 120 such as the conductive cover 132. The body 361 may be mounted on the circuit board 140 to be electrically connected in series to the electric shock protection elements 200, 300, and 400.

The conductive wire 362 may be obliquely formed inside the body 361. The conductive wire 362 is intended to improve electrical contact with the conductive cover 132 and to complement an elastic force of the body 361.

For example, an upper end of the conductive wire 362 is tilted toward left and right sides when the conductive wire 362 is pressed by the conductive cover 132, and the upper end of the conductive wire 362 is restored to an original vertical state thereof when the conductive cover 132 is removed such that the elastic force of the body 361 may be compensated. In this case, when the conductive wire 362 is tilted by a pressing force of the conductive cover 132, contact with the conductive cover 132 becomes excellent, and thus a leakage current, static electricity, conductivity of a communication signal, or the like can be improved.

Therefore, the conductive wire 362 may have excellent conductivity of a communication signal and excellent elastic restoring force, and may be used for a long time when compared to the vertically formed conductive wire 262 of FIG. 29 which is bent downward by the pressing force of the conductive cover 132.

Figure 31:
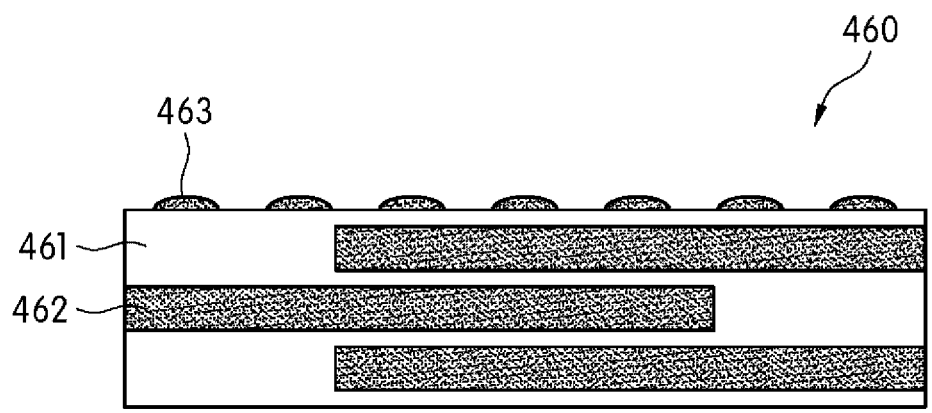

As illustrated in FIG. 31, in the case in which the conductive connecting part is a silicon rubber pad 460, the silicon rubber pad 460 includes a body 461, conductive layers 462, and contact parts 463.

The body 461 may be made of a silicon rubber, and a lower portion of the body 461 may be mounted on the circuit board 140 to be electrically connected in series to the electric shock protection elements 200, 300, and 400.

The conductive layers 462 may be horizontally and alternately stacked inside the body 461, and may be a plurality of layers made with a curable Ag paste. The conductive layers 462 are intended to improve electrical contact with the conductive cover 132 and to complement an elastic force of the body 461.

For example, the conductive layers 462 are pressed downward in the vicinity of a central portion thereof when the conductive layers 462 are pressed by the conductive cover 132, and the conductive layers 462 are restored to original vertical states thereof when the conductive cover 132 is removed such that the elastic force of the body 461 may be compensated. Therefore, the conductive layers 462 may have an excellent elastic restoring force and may be used for a long time when compared to the vertically formed conductive wire 262 of FIG. 29 which is bent downward by the pressing force of the conductive cover 132 or the diagonally-formed conductive wire 362 of FIG. 30 which is tilted to the left and right sides.

The contact parts 463 may be formed to have a curved protrusion shape on an upper side of the body 461. The contact parts 463 may come into contact with the conductive cover 132 with a plurality of lines or a surface to increase a contact area with the conductive cover 132. Therefore, a leakage current, static electricity, or conductivity of a communication signal may be improved through the silicon rubber pad 460.

Figure 32:
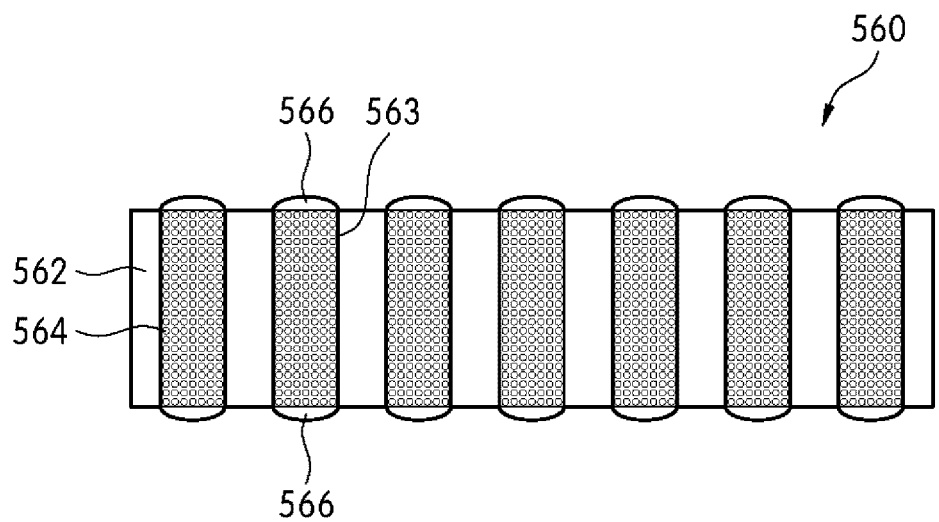

As illustrated in FIG. 32, in a case in which the conductive connecting part is a silicon rubber pad 560 including conductive particles, the silicon rubber pad 560 includes a body 562, conductive parts 564, and contact parts 566.

The body 562 may be made of a non-conductive silicon rubber, and may include through-holes 563 which are formed to vertically pass therethrough at a plurality of positions thereinside. In this case, the body 562 may come into contact with the conductive cover 132 through the contact parts 566 formed on one side of the body 562, may be mounted on the circuit board 140 through the contact parts 566 formed on the other side of the body 562, and may be electrically connected to the electric shock protection elements 200, 300, and 400.

The conductive parts 564 may be made of a conductive silicon rubber and conductive particles. The conductive parts 564 may be formed by filling the plurality of through-holes 563 with the conductive silicon rubber and the conductive particles. Here, the conductive silicon rubber may have a function of fixing a position of the conductive particles in the through hole 563, and the conductive particles may be regularly or irregularly dispersed in the conductive silicon rubber.

In this case, the conductive particles may be spaced apart from each other and are not conducted when external pressure or heat are not applied to the conductive particles, and the conductive particles may come into contact with each other to be conducted by shrinkage of the conductive silicon rubber when the external pressure or heat are applied to the conductive particles.

The conductive parts 564 may come into electrical contact with the conductive cover 132 by the conductive particles, and at the same time, shrinkage and expansion thereof may be implemented by the conductive silicon rubber. Therefore, the conductive parts 564 may simultaneously provide electrical contact and an elastic restoring force by pressurization.

For example, when the conductive parts 564 are pressed by the conductive cover 132, the conductive silicon rubber is shrunk, the conductive particles come into contact with each other, and electrical connections of the conductive parts 564 are made by the conductive particles, and when the conductive cover 132 is removed, the conductive parts 564 may be restored to original states thereof by an elastic force of the conductive rubber. Therefore, since the conductive parts 564 have an excellent elastic restoring force and are made of the same or similar material as the body 562 when compared to the conductive wires 262 and 362 or the conductive layer 462 of FIGS. 29 to 31, internal deformation of the conductive parts 564 may be reduced such that the conductive parts 564 may be used for a long time.

The contact parts 566 may be formed to have a curved protrusion shape on both sides of each of the conductive parts 564. The contact parts 566 may come into contact with the conductive cover 132 with a plurality of lines or a surface to increase the contact area with the conductive cover 132. Therefore, a leakage current, static electricity, or conductivity of a communication signal may be improved through the silicon rubber pad 560.

Figure 33:
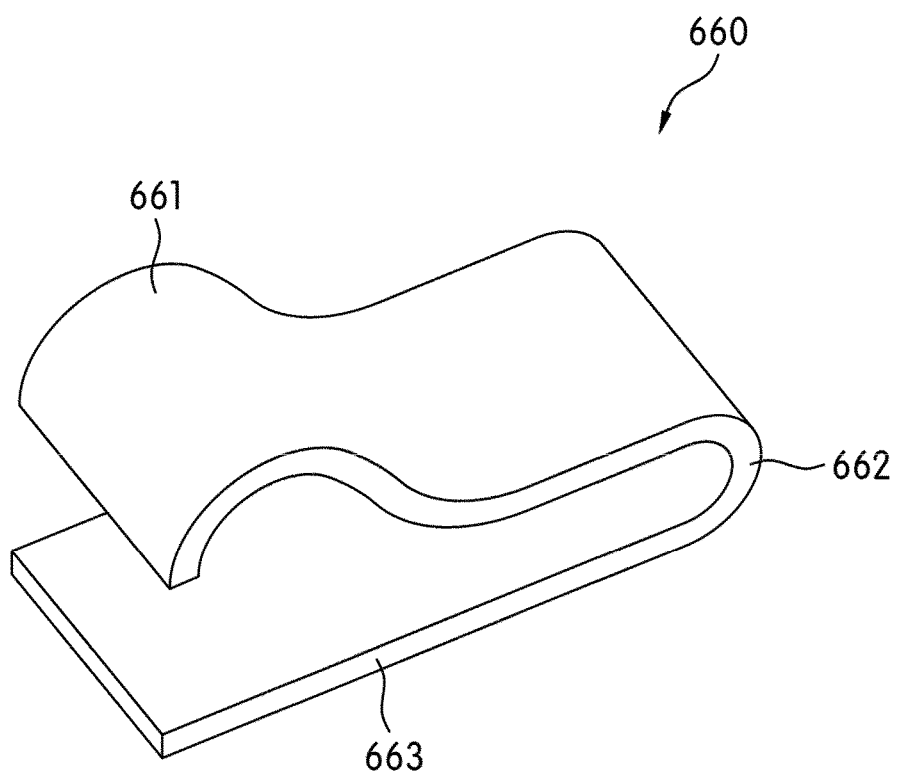

As illustrated in FIG. 33, in the case in which the conductive connecting part is a clip-shaped conductor 660, the clip-shaped conductor 660 includes a contact part 661, a bent part 662, and a terminal part 663.

The contact part 661 may have a curved shape and come into electrical contact with the conductive cover 160. The bent part 662 may extend from the contact part 661 and have an elastic force. The terminal part 663 may include a terminal electrically connected in series to the electric shock protection elements 200, 300, and 400 through the circuit board 140.

The contact part 661, the bent part 662, and the terminal part 663 may be integrally formed with a conductive material having an elastic force.

Figure 34:
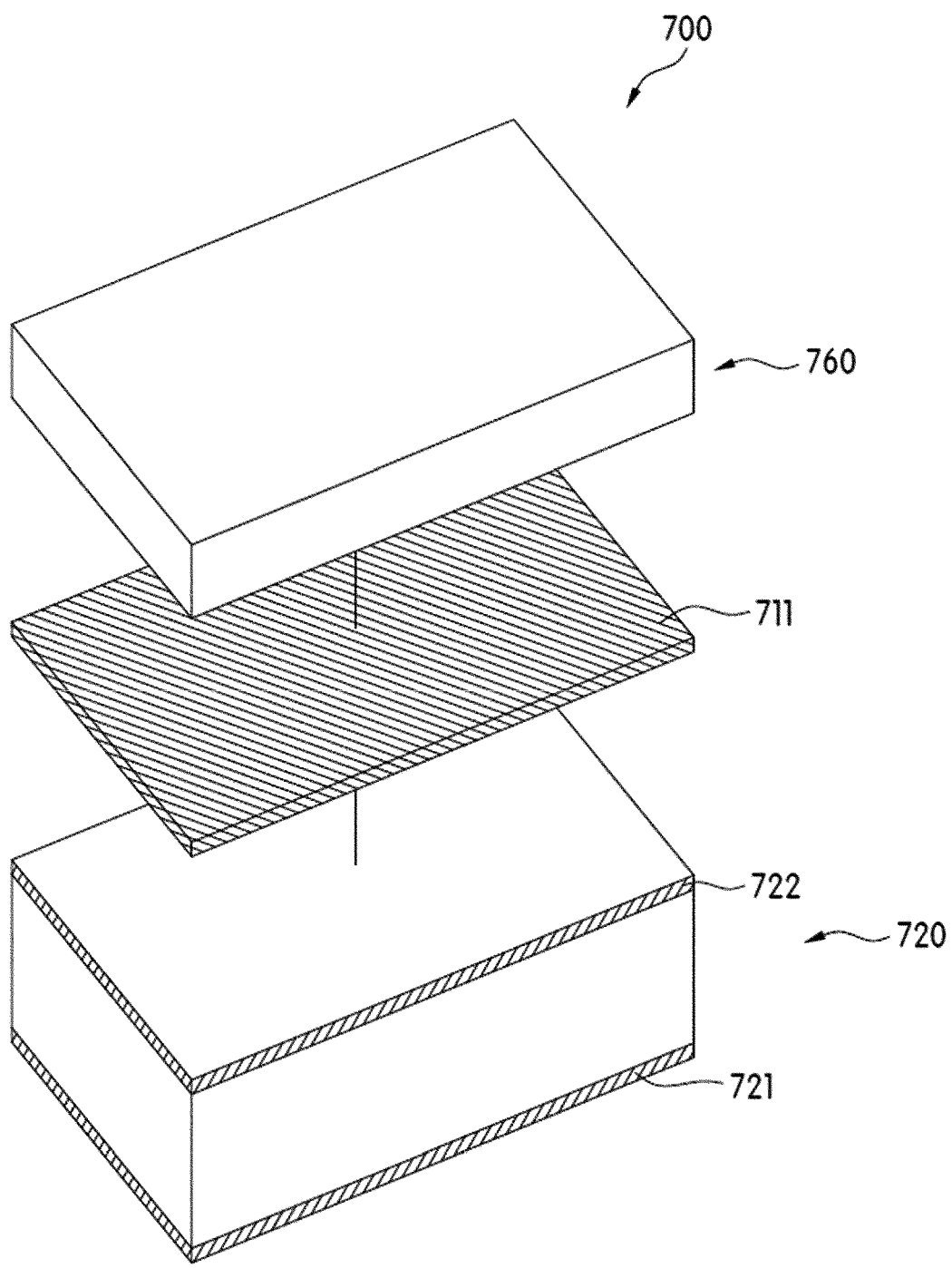
FIGS. 34 and 35 are exploded perspective views illustrating examples of various electric shock protection contactors that can be used in the portable electronic device with an embedded electric shock protection function according to one embodiment of the present invention.
Figure 35:
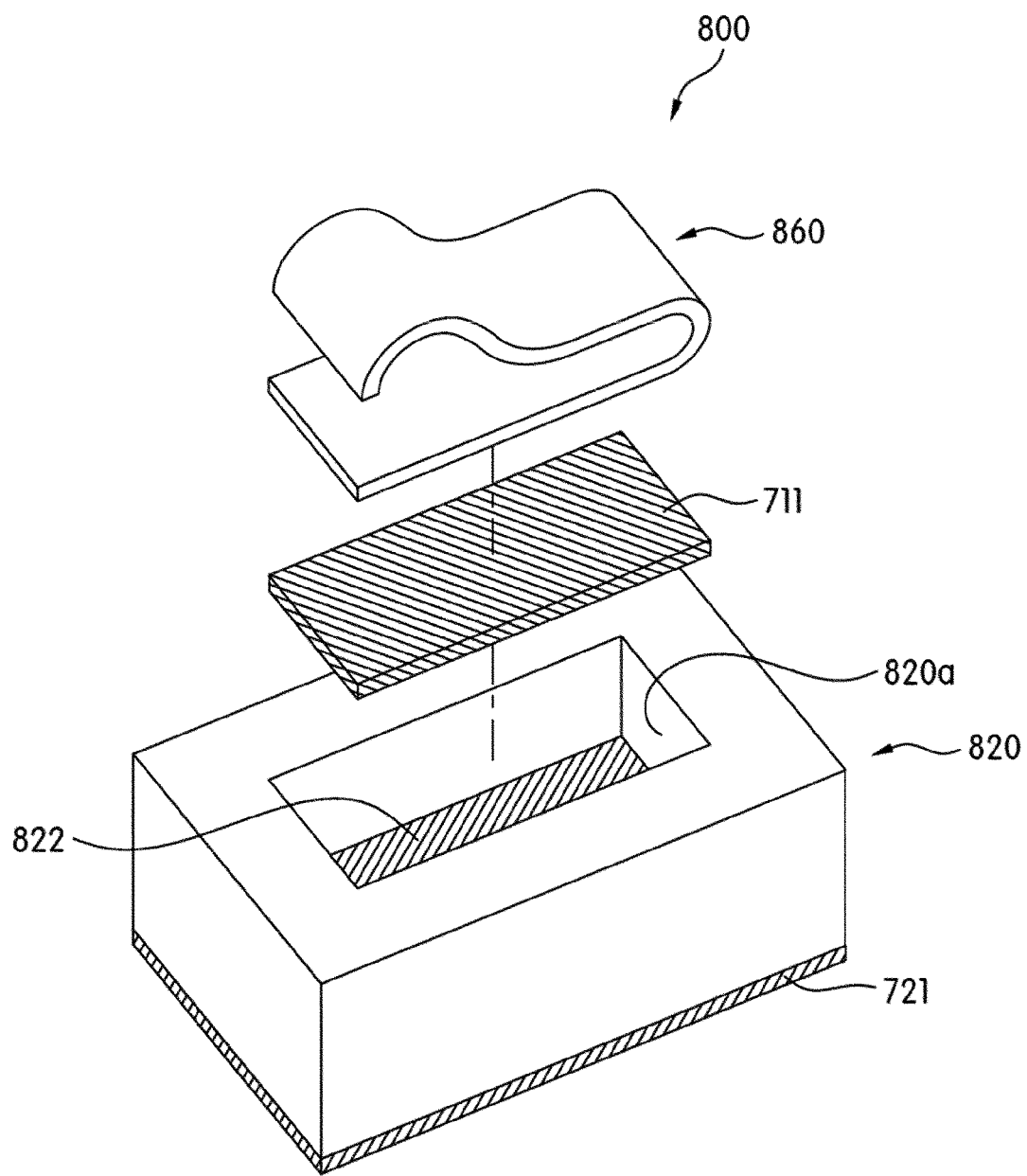

FIGS. 34 and 35 illustrate examples of conductive contactors 700 and 800 that can be used in the portable electronic device with an embedded electric shock protection function according to one embodiment of the present invention. Each of the conductive contactors 700 and 800 includes the electric shock protection element 200, 300, or 400 and the conductive connecting part 160, 260, 360, 460, 560, or 660, which are integrally formed.

Since separate elements for implementing corresponding functions and additional spaces for the elements are not required due to the conductive contactors 700 and 800, the conductive contactors 700 and 800 may be suitable for miniaturization of the portable electronic device.

As illustrated in FIG. 34, the conductive contactor 700 includes a conductive connecting part 760 and an electric shock protection element 720.

Although the conductive connecting part 760 is illustrated as having a box shape, the present invention is not limited thereto. That is, the conductive connecting part 760 may be the conductive gasket 160, the silicon rubber pad 260, 360, 450, or 560, and the clip-shaped conductor 660 having an elastic force, which have been described with reference to FIGS. 28 to 32.

An external electrode 721 and a connecting electrode 722 may be formed on a lower surface and upper surface of the electric shock protection element 720, respectively. In this case, a conductive adhesive layer 711 may be applied to the connecting electrode 722 formed on the upper surface of the electric shock protection element 720, and the conductive connecting part 760 may be stacked on the conductive adhesive layer 711.

Here, the connecting electrode 722 may be one external electrode of the electric shock protection element 720 as illustrated in FIGS. 4 and 5. In this case, an intermediate electrode for connecting the connecting electrode or the external electrode to the internal electrode may be provided.

Here, although the electric shock protection element 720 is described as being disposed below the conductive connecting part 760, the present invention is not limited thereto. For example, the electric shock protection element 720 may be integrally formed therewith in a horizontal direction of the conductive connecting part 760.

As another example, as illustrated in FIG. 35, the electric shock protection contactor 800 may include an accommodation part 82a on an upper side of an electric shock protection element 820. That is, the accommodation part 820a for accommodating a clip-shaped conductor 860 may be provided on the upper side of the electric shock protection element 820, and at least a part of the clip-shaped conductor 860 may be inserted into the accommodation part 820a.

Here, a connecting electrode 822 is formed to be exposed to the outside from the bottom of the accommodation part 820a. The connecting electrode 822 may be one external electrode of the electric shock protection element 820 as illustrated in FIGS. 4 and 5. In this case, an intermediate electrode for connecting the connecting electrode or the external electrode to the internal electrode may be provided.

In this case, the clip-shaped conductor 860 may be stacked on the connecting electrode 822 via the conductive adhesive layer 711.

Since the accommodation part 820a may serve as a side stopper, a separate side stopper may not be provided in the clip-shaped conductor 860, and thus a manufacturing cost may be reduced. Also, since at least the part of the clip-shaped conductor 860 is inserted into the accommodation part 820a, warping and bending after the coupling may be prevented, and specifically, falling or deviating from a correct position in a reflow process after a strategic management decision (SMD) may be prevented.

Here, although the conductive connecting part 860 is illustrated as a clip-shaped conductor, the present invention is not limited thereto. That is, the conductive connecting part 860 may be any one of the conductive gasket 160 and the silicon rubber pads 260, 360, 450, and 560, which are described with reference to FIGS. 28 to 31.

While the embodiments of the preset invention have been described above, the spirit of the present invention is not limited to the embodiments set forth herein, and those skilled in the art, who understand the spirit of the present invention, can easily suggest another embodiment by adding, changing, deleting, adding, or the like elements within the same scope, and such an embodiment is also within the scope of the present invention.

What is claimed is:

1. A portable electronic device with an embedded electric shock protection function, the portable electronic device comprising:

a circuit board;
a camera module mounted on the circuit board;
a conductive cover disposed to cover a part of an upper side of the camera module;
a conductive connecting part having an elastic force and having one end electrically connected to a lower surface of the conductive cover and the other end mounted on the circuit board; and
an electric shock protection element mounted on the circuit board to be connected in series to the other end of the conductive connecting part and configured to pass static electricity introduced from the conductive cover to the circuit board and block a leakage current of an external power source introduced into a ground of the circuit.

2. The portable electronic device of claim 1, wherein:
the conductive cover comprises a supporter which horizontally extends at a lower side thereof; and
the conductive connecting part is disposed at one side of the supporter.

3. The portable electronic device of claim 2, further comprising a support member disposed between the other side of the supporter and the circuit board.

4. The portable electronic device of claim 3, wherein the support member is any one of an insulator and the conductive connecting part.

5. The portable electronic device of claim 1, wherein a through-hole corresponding to a lens of the camera module is provided at a center of the conductive cover.

6. The portable electronic device of claim 1, wherein the conductive cover and the conductive connecting part are spaced a predetermined distance from the camera module.

7. The portable electronic device of claim 1, wherein the circuit board comprises a pad and a wiring to electrically connect the conductive connecting part to the electric shock protection element in series.

8. The portable electronic device of claim 1, wherein the conductive connecting part is disposed at a side portion of the conductive cover.

9. The portable electronic device of claim 1, wherein the electric shock protection element satisfies the following expression:

$$Vbr>Vin$$

where, Vbr is a breakdown voltage of the electric shock protection element and Vin is a rated voltage of the external power source.

10. The portable electronic device of claim 1, wherein the conductive connecting part is any one of a conductive gasket, a silicon rubber pad, and a clip-shaped conductor having an elastic force.

11. The portable electronic device of claim 10, wherein the conductive gasket comprises at least one of a polymer body, a natural rubber, a sponge, a synthetic rubber, a heat-resistant silicon rubber, and a tube, formed by thermo-compression bonding of a conductive paste.

12. The portable electronic device of claim 10, wherein the silicon rubber pad comprises:
a body made of a silicon rubber; and
a conductive wire vertically formed inside the body.

13. The portable electronic device of claim 10, wherein the silicon rubber pad comprises:
a body made of a silicon rubber;
a plurality of conductive layers horizontally and alternately stacked inside the body; and
a plurality of contact parts formed to have a curved protrusion shape at an upper side of the body.

14. The portable electronic device of claim 10, wherein the silicon rubber pad comprises:
a body made of a non-conductive silicon rubber;
a conductive part comprising a plurality of through-holes which are formed vertically through an inside of the body and filled with a conductive silicon rubber and conductive particles; and
a plurality of contact parts formed to have a curved protrusion shape at both sides of the conductive part.

15. The portable electronic device of claim 10, wherein the clip-shaped conductor comprises:
a contact part having a curved shape and configured to come into contact with the conductive cover;
a bent part having an elastic force and configured to extend from the contact part; and
a terminal part electrically connected to the electric shock protection element.

16. The portable electronic device of claim 9, wherein the electric shock protection element comprises:
a sintered body formed by stacking a plurality of sheet layers; and
at least one pair of internal electrodes formed to be spaced a predetermined distance from each other inside the sintered body.

17. The portable electronic device of claim 16, wherein the electric shock protection element further comprises an air gap formed between the pair of internal electrodes.

18. The portable electronic device of claim 17, wherein the air gap comprises a discharge material layer coated on an inner wall thereof to a predetermined thickness in a height direction.

19. The portable electronic device of claim 16, wherein the pair of internal electrodes are disposed on the same plane or are disposed to face each other in a vertical direction.

20. The portable electronic device of claim 9, wherein the electric shock protection element comprises:
at least two varistor material layers in which a first varistor material layer and a second varistor material layer are alternately stacked;
a plurality of first internal electrodes spaced a predetermined distance (L1) from each other on the first varistor material layer; and
a plurality of second internal electrodes spaced a predetermined distance (L1) from each other on the second varistor material layer.

21. The portable electronic device of claim 20, wherein the breakdown voltage (Vbr) is a sum of unit breakdown voltages formed between the second internal electrode and each of the nearest first internal electrodes.

22. The portable electronic device of claim 20, wherein the first internal electrode and the second internal electrode are disposed so that at least a part of the first internal electrode and at least a part of the second internal electrode overlap or do not overlap.

23. The portable electronic device of claim 20, wherein the distance (L1) is greater than a shortest distance (d1) between any one of the first internal electrodes and any one of the second internal electrodes.

24. A portable electronic device with an embedded electric shock protection function, the portable electronic device comprising:
a circuit board;
a camera module mounted on the circuit board;
a conductive cover disposed to cover a part of an upper side of the camera module; and an electric shock protection contactor having one end electrically connected to the conductive cover and the other end electrically connected in series to the circuit board, wherein the electric shock protection contactor comprises:

a conductive connecting part having an elastic force and having one end electrically connected to a lower surface of the conductive cover; and an electric shock protection element having one end connected in series to the other end of the conductive connecting part and the other end connected to the circuit board and configured to pass static electricity introduced from the conductive cover to the circuit board and block a leakage current of an external power source introduced into a ground of the circuit board.

25. The portable electronic device of claim 24, wherein:

the electric shock protection element comprises a connecting electrode on an upper surface thereof and an external electrode on a lower surface thereof; and the conductive connecting part is stacked on the connecting electrode formed on the upper surface of the electric shock protection element via a conductive adhesive layer.

26. The portable electronic device of claim 24, wherein the electric shock protection element comprises:

an accommodation part formed on an upper side thereof;

a connecting electrode formed on a bottom surface of the accommodation part; and a conductive adhesive layer formed on an upper surface of the connecting electrode, wherein the conductive connecting part is fixed by the conductive adhesive layer.

* * * * *